(12) United States Patent
Romero et al.

(10) Patent No.: US 9,389,060 B2
(45) Date of Patent: Jul. 12, 2016

(54) MAGNETIC FIELD SENSOR AND RELATED TECHNIQUES THAT PROVIDE AN ANGLE ERROR CORRECTION MODULE

(71) Applicants: Hernan D. Romero, Buenos Aires (AR); Ricardo Scheinkerman, Ciudad Autonoma de Buenos Aires (AR); Gerardo A. Monreal, Buenos Aires (AR)

(72) Inventors: Hernan D. Romero, Buenos Aires (AR); Ricardo Scheinkerman, Ciudad Autonoma de Buenos Aires (AR); Gerardo A. Monreal, Buenos Aires (AR)

(73) Assignee: Allegro Microsystems, LLC, Worcester, MA (US)

( * ) Notice: Subject to any disclaimer, the term of this patent is extended or adjusted under 35 U.S.C. 154(b) by 455 days.

(21) Appl. No.: 13/766,327

(22) Filed: Feb. 13, 2013

(65) Prior Publication Data

US 2014/0225597 A1   Aug. 14, 2014

(51) Int. Cl.
*G01R 33/00* (2006.01)
*G01B 7/02* (2006.01)
*G01R 33/07* (2006.01)

(52) U.S. Cl.
CPC .............. *G01B 7/023* (2013.01); *G01R 33/007* (2013.01); *G01R 33/0023* (2013.01); *G01R 33/077* (2013.01); *G01R 33/075* (2013.01)

(58) Field of Classification Search
USPC ................... 324/207.2, 207.25, 251, 207.12, 324/207.13, 207.22, 225; 702/151, 150, 94, 702/104; 257/421, 427
See application file for complete search history.

(56) References Cited

U.S. PATENT DOCUMENTS

| | | | |
|---|---|---|---|
| 4,327,416 | A | 4/1982 | Jerrim |
| 4,668,914 | A | 5/1987 | Kersten et al. |
| 4,725,957 | A | 2/1988 | Alberter et al. |
| 4,761,569 | A | 8/1988 | Higgs |
| 4,829,352 | A | 5/1989 | Popovic et al. |
| 5,331,218 | A | 7/1994 | Moody |
| 5,541,506 | A | 7/1996 | Kawakita et al. |
| 5,572,058 | A | 11/1996 | Biard |

(Continued)

FOREIGN PATENT DOCUMENTS

| | | |
|---|---|---|
| DE | 10 2005 014 509 B4 | 10/2006 |
| DE | 10 2005 024879 A1 | 12/2006 |

(Continued)

OTHER PUBLICATIONS

Kejik et al.; "Circular Hall Transducer for Angular Position Sensing;" 2007 IEEE Solid-State Sensors and Microsystems Conference, Transducers, 2007; Jun. 10-14, 2007; pp. 2593-2596.

(Continued)

*Primary Examiner* — Melissa Koval
*Assistant Examiner* — Nasima Monsur
(74) *Attorney, Agent, or Firm* — Daly, Crowley, Mofford & Durkee, LLP

(57) ABSTRACT

A magnetic field sensor can include a plurality of magnetic field sensing elements; an angle processing circuit to generate an uncorrected x-y angle value representative of an angle of a magnetic field in an x-y plane, the uncorrected x-y angle value comprising a first angle error component; an angle error correction module to generate an x-y angle error value indicative of an error in the uncorrected x-y angle value, wherein the angle error correction module uses a sinusoidal error relationship, a sine look up table, and a coefficient table memory to determine the x-y angle error value; and a combining module to combine the uncorrected x-y angle value with the x-y angle error value. A similar method is used.

36 Claims, 9 Drawing Sheets

(56) References Cited

U.S. PATENT DOCUMENTS

| | | | |
|---|---|---|---|
| 5,612,618 A | 3/1997 | Arakawa | |
| 5,619,137 A | 4/1997 | Vig et al. | |
| 5,621,319 A | 4/1997 | Bilotti et al. | |
| 5,657,189 A | 8/1997 | Sandhu | |
| 5,694,038 A | 12/1997 | Moody et al. | |
| 5,831,513 A | 11/1998 | Lue | |
| 5,844,411 A | 12/1998 | Vogt | |
| 5,942,895 A | 8/1999 | Popovic et al. | |
| 6,064,199 A | 5/2000 | Walter et al. | |
| 6,064,202 A | 5/2000 | Steiner et al. | |
| 6,091,239 A | 7/2000 | Vig et al. | |
| 6,100,680 A | 8/2000 | Vig et al. | |
| 6,166,535 A | 12/2000 | Irle et al. | |
| 6,232,768 B1 | 5/2001 | Moody et al. | |
| 6,236,199 B1 | 5/2001 | Irle et al. | |
| 6,265,864 B1 | 7/2001 | De Winter et al. | |
| 6,288,533 B1 | 9/2001 | Haeberli et al. | |
| 6,297,627 B1 | 10/2001 | Towne et al. | |
| 6,356,741 B1 | 3/2002 | Bilotti et al. | |
| 6,525,531 B2 | 2/2003 | Forrest et al. | |
| 6,542,068 B1 | 4/2003 | Drapp et al. | |
| 6,545,462 B2 | 4/2003 | Schott et al. | |
| 6,622,012 B2 | 9/2003 | Bilotti et al. | |
| 6,686,733 B2 | 2/2004 | Muth | |
| 6,768,301 B1 | 7/2004 | Hohe et al. | |
| 6,969,988 B2 | 11/2005 | Kakuta et al. | |
| 7,030,606 B2 | 4/2006 | Kato et al. | |
| 7,038,448 B2 | 5/2006 | Schott et al. | |
| 7,085,119 B2 | 8/2006 | Bilotti et al. | |
| 7,119,538 B2 | 10/2006 | Blossfeld | |
| 7,159,556 B2 | 1/2007 | Yoshihara | |
| 7,235,968 B2 | 6/2007 | Popovic et al. | |
| 7,259,556 B2 | 8/2007 | Popovic et al. | |
| 7,307,824 B2 | 12/2007 | Bilotti et al. | |
| 7,362,094 B2 | 4/2008 | Voisine et al. | |
| 7,714,570 B2 | 5/2010 | Thomas et al. | |
| 7,746,065 B2 | 6/2010 | Pastre et al. | |
| 7,759,929 B2 | 7/2010 | Forsyth | |
| 7,872,322 B2 | 1/2011 | Schott et al. | |
| 7,911,203 B2 | 3/2011 | Thomas et al. | |
| 7,965,076 B2 | 6/2011 | Schott | |
| 7,990,209 B2 | 8/2011 | Romero | |
| 7,994,774 B2 | 8/2011 | Thomas et al. | |
| 8,350,563 B2 | 1/2013 | Haas et al. | |
| 8,416,014 B2 | 4/2013 | Romero | |
| 2003/0042894 A1 | 3/2003 | Waffenschmidt | |
| 2003/0057941 A1 | 3/2003 | Collier-Hallman et al. | |
| 2005/0248306 A1* | 11/2005 | Chen et al. | 318/712 |
| 2005/0278137 A1* | 12/2005 | Hammerschmidt et al. | 702/151 |
| 2006/0011999 A1 | 1/2006 | Schott et al. | |
| 2006/0290545 A1 | 12/2006 | Granig et al. | |
| 2007/0029998 A1 | 2/2007 | Popovic et al. | |
| 2009/0121707 A1 | 5/2009 | Schott | |
| 2009/0174395 A1 | 7/2009 | Thomas et al. | |
| 2010/0030427 A1 | 2/2010 | Mitsuhara et al. | |
| 2010/0156397 A1 | 6/2010 | Yabusaki et al. | |
| 2010/0164491 A1 | 7/2010 | Kejik et al. | |
| 2011/0043197 A1* | 2/2011 | Trontelj | 324/207.25 |
| 2011/0248708 A1 | 10/2011 | Thomas et al. | |
| 2012/0086442 A1* | 4/2012 | Haas et al. | 324/225 |
| 2012/0095712 A1 | 4/2012 | Komasaki et al. | |
| 2012/0158335 A1 | 6/2012 | Donovan et al. | |
| 2012/0262155 A1* | 10/2012 | Donovan et al. | 324/207.2 |
| 2013/0265037 A1 | 10/2013 | Friedrich et al. | |

FOREIGN PATENT DOCUMENTS

| | | |
|---|---|---|
| DE | 102005024879 A1 | 12/2006 |
| DE | 10 2006 037 226 A1 | 2/2008 |
| EP | 0 631 416 B1 | 12/1994 |
| EP | 0 875 733 B1 | 11/1998 |
| EP | 0 916 074 B1 | 5/1999 |
| EP | 2 000 814 A2 | 12/2008 |
| JP | 58-055688 A | 4/1983 |
| JP | 2003-042709 | 2/2003 |
| JP | 2005-241269 | 9/2005 |
| JP | 2010-014607 | 1/2010 |
| JP | 2010-078366 | 4/2010 |
| WO | WO 98/02721 | 1/1998 |
| WO | WO 98/10302 | 3/1998 |
| WO | WO 98/54547 | 12/1998 |
| WO | WO 00/02266 | 1/2000 |
| WO | WO 03/036732 A2 | 5/2003 |
| WO | WO 2004/025742 A1 | 3/2004 |
| WO | WO 2006/056289 A1 | 6/2006 |
| WO | WO 2006/074989 A2 | 7/2006 |
| WO | WO 2008 145662 A1 | 12/2008 |
| WO | WO 2009/124969 A1 | 10/2009 |
| WO | WO 2014/126670 | 8/2014 |

OTHER PUBLICATIONS

Reymond et al.; "True 2D CMOS Integrated Hall Sensor;"0 2007 IEEE Sensors Conference; Oct. 28-31, 2007; pp. 860-863.

Schurig et al.; "CMOS Integrated Vertical Hall Sensor With Low Offset;" XVI The 16$^{th}$ European Conference on Solid-State Transducers; Prague, Czech Republic; Sep. 16-19, 2002; pp. 868-871.

U.S. Appl. No. 13/947,608, filed Jul. 22, 2013, Daubert et al.

Allegro Microsystems, Inc.; "High Precision Linear Hall Effect Sensor IC With a Push/Pull, Pulse Width Modulated Output," A1351; pp. 1-23.

Allegro Microsystems, Inc.; "High Precision 2-Wire Linear Hall Effect Sensor IC With a Pulse Width Modulated Output;" A1354; pp. 1-22.

Allegro Microsystems, Inc.; "High Precision Linear Hall-Effect Sensor With an Open Drain Pulse Width Modulated Output;" A1356; pp. 1-20.

Allegro Microsystems, Inc.; "Low-Noise Programmable Linear Hall Effect Sensor ICs With Adjustable Bandwidth (50 kHz Maximum) and Analog Output;" A1360, A1361 and A1362; pp. 1-25.

Baschirotto at al; "Development and Analysis of a PCB Vector 2-D Magnetic Field Sensor System for Electronic Compasses;" IEEE Sensors Journal, vol. 6, No. 2; Apr. 2006; pp. 365-371.

Kejik, et al.; "Purley CMOS Angular Position Sensor Based on a New Hall Microchip;" 34$^{th}$ Annual Conference of IEEE Industrial Electronics; IECON; Nov. 10-13, 2008; pp. 1777-1781.

Kejik,.et al.; "Ultra Low-Power Angular Position Sensor for High-Speed Portable Applications;" 2009 IEEE Sensors Conference Conference; Oct. 25-28, 2009; pp. 173-176.

Reymond, et al.; "True 2D CMOS Integrated Hall Sensor;" 2007 IEEE Sensors Conference; Oct. 28-31, 2007; pp. 860-863.

Gerhauser; "Intelligente 3D-Magnetfeld Snesorik;" Fraunhofer-Institut for Integrierte Schaltungen IIS; www.iis.fraunhofer.de/asic/analog; Oct. 2009; 2 pages.

Melexis Microelectronic Integrated Systems; MLX90333; "Triaxis 3D-Joystick Position Sensor;" Data Sheet; Mar. 2009; 43 pages.

MEMSIC Corporation; AN-00MM-004; "Electronic Tilt Compensation;" Mar. 2008; 5 pages.

MEMSIC Corporation; AN-00MM-003; "Magnetic Sensor Calibration;" Mar. 2008; 5 pages.

MEMSIC Corporation; AN-00MM-002; "Magnetometer Soldering Methodology;" Jun. 2008; 2 pages.

MEMSIC Corporation; AN-00MM-001; "Magnetometer Fundamentals;" Jun. 2008; 6 pages.

MEMSIC Corporation; AN-00MM-005; "Magnetic Sensor Placement Guidelines;" Oct. 2008; 2 pages.

MEMSIC Corporation; MMC312xMQ; "Tri-Axis Magnetic Sensor, with I$^2$C Interface;" Aug. 14, 2008; 9 pages.

MEMSIC Corporation; MMC314xMS; "Ultra Small 3-axis Magnetic Sensor, with I$^2$C Interface;" Mar. 31, 2010; 8 pages.

Micronas GmbH; "HAL® 3625 Programmable Direct Angle Sensor;" Product Information; Sep. 2009; 2 pages.

Drijaca, et al.; "Nonlinear Effects in Magnetic Angular Position Sensor With Integrated Flux Concentrator," Proc. 23$^{rd}$ International Conference on Microelectronics (MIEL 2002); vol. 1; NIS; Yugoslavia; May 12-15, 2002; pp. 223-226.

(56) References Cited

OTHER PUBLICATIONS

Petrie; "Circular Vertical Hall Magnetic Field Sensing Element and Method with a Plurality of Continuous Output Signals;" U.S. Appl. No. 13/035,243, filed Feb. 25, 2011; 56 pages.
Melexis MLX 90324; ""Under-the-Hood" Triaxis Rotary Position feat. SENT Protocol;" 3901090324 Data Sheet; Dec. 2008; 40 pages.
Allegro Microsystems, Inc.; "A1140/41/42/43 Data Sheet: Sensitive Two-Wire Chopper-Stabilized Unipolar Hall-Effect Switches;" published Sep. 9, 2004; pp. 1-11.
Allegro Microsystems, Inc.; "A1174 Data Sheet: Ultrasensitive Hall Effect Latch With Internally or Externally Controlled Sample and Sleep Periods for Track Ball and Scroll Wheel Applications;" published Jul. 25, 2008; pp. 1-13.
Allegro Microsystems, Inc.; "A1230 Data Sheet: Ultra-Sensitive Dual-Channel Quadrature Hall-Effect Bipolar Switch;" published Mar. 26, 2010; 16 sheets.
Allegro Microsystems, Inc.; "A1351 Data Sheet: High Precision Linear Hall Effect Sensor with a Push/Pull, Pulse Width Modulated Output;" published Mar. 7, 2008; pp. 1-23.
Allegro Microsystems, Inc.; "A1360, A1361 and A1362 Data Sheet: Low-Noise Programmable Linear Hall Effect Sensors With Adjustable Bandwidth (50 $kHz$ Maximum) and Analog Output;" published Mar. 18, 2008; pp. 1-25.
Allegro Microsystems, Inc.; "A3212 Data Sheet: Micropower, Ultra-Sensitive Hall-Effect Switch;" published Sep. 22, 2004; pp. 1-12.
Allegro Microsystems, Inc.; "ATS675LSE Data Sheet: Self-Calibrating TPOS Speed Sensor Optimized for Automotive Cam Sensing Applications;" published Jul. 11, 2008; pp. 1-13.
Allegro Microsystems, Inc.; "27701-AN Data Sheet: Hall-Effect IC Applications Guide;" Application Information, Rev. 2; http://www.allegromicro.com/en/products/design/hall-effect-sensor-ic-applications-guide/AN27701.pdf; downloaded Sep. 29, 2010; pp. 1-40.
Allegro Microsystems, Inc.; "3235 Data Sheet 27633A, Dual-Output Hall-Effect Switch;" http://www.datasheetcatalog.org/datasheets/90/205047_DS.pdf; downloaded Sep. 29, 2010; 6 sheets.
Allegro Microsystems, Inc.; "A3425 Data Sheet: Dual, Chopper-Stabilized, Ultra-Sensitive Bipolar Hall-Effect Switch;" published Jun. 28, 2002; pp. 1-10.
Atherton et al.; "Sensor Signal Conditioning—an IC Designer's Perspective;" IEEE Electro International; Apr. 26-28, 1991; pp. 129-134.
Austria Microsystems; "AS5040 datasheet; 10-Bit Programmable Magnetic Rotary Encoder;" Revision 1.1; Jan. 2004; pp. 1-20.
Banjevic et al; "2D CMOS Integrated Magnetometer Based on the Miniaturized Circular Vertical Hall Device;" International Solid-State Sensors, Actuators and Microsystems Conference; Transducers; Jun. 21-25, 2009; pp. 877-880.
Blanchard et al.; "Cylindrical Hall Device;" International Electron Devices Meeting; Dec. 8-11, 1996; pp. 541-544.
Burger et al.; "New fully integrated 3-D silicon Hall sensor for precise angular-position measurements;" Sensors and Actuators, A 67; May 1998; pp. 72-76.
Dwyer; "Allegro Microsystems, Inc.; AN296061 Data Sheet: Ring Magnet Speed Sensing for Electronic Power Steering;" published Jul. 21, 2009; pp. 1-4.
Freitas et al.; "Giant magnetoresistive sensors for rotational speed control;" Jorunal of Applied Physics, vol. 85, No. 8; Apr. 15, 1999; pp. 5459-5461.
Gilbert; "Technical Advances in Hall-Effect Sensing;" Allegro Microsystems, Inc. Product Description; May 10, 2008; 7 sheets.
Häberli et al.; "Contactless Angle Measurements by CMOS Magnetic Sensor with On Chip Read-Out Circuit;" The $8^{th}$ International Conference on Solid-State Sensors and Actuators and Eurosensors IX; Jan. 25-29, 1995; pp. 134-137.
Häberli et al.; "Two-Dimensional Magnetic Microsensor With On-Chip Signal Processing for Contactless Angle Measurement;" IEEE Journal of Solid-State Circuits, vol. 31, No. 12; Dec. 1996; pp. 1902-1907.
Hiligsmann et al.; "Monolithic 360 Degrees Rotary Position Sensor IC;" 2004 IEEE Proceedings of Sensors, vol. 3; Oct. 24-27, 2004; pp. 1137-1142.
Kejik et al.; "Circular Hall Transducer for Angular Position Sensing;" International Solid-State Sensors, Actuators and Microsystems Conference; Transducers; Jun. 2007; pp. 2593-2596.
Lou Law; "Angle Position Sensing With 2-Axis Hall ICs;" Sensors Magazine, vol. 20, No. 3; Mar. 2003; 7 sheets.
Masson et al.; "Multiturn and high precision through-shaft magnetic sensors;" Sensor + Text Conference; Proceedings II; May 2009; pp. 41-46.
Metz et al.; "Contactless Angle Measurement Using Four Hall Devices on Single Chip;"; International Conference on Solid State Sensors and Actuators; Transducers; vol. 1; Jun. 16-19, 1997; pp. 385-388.
Munter; "A Low-offset Spinning-current Hall Plate;" Sensors and Actuators, vol. A21-A23; Jan. 1990; pp. 743-746.
Novotechnik Siedle Group; "How New Angular Positioning Sensor Technology Opens a Broad Range of New Applications;" Vert-X Technology; Dec. 2001; pp. 1-5.
Paranjape et al.; "A CMOS-compatible 2-D vertical Hall magnetic-field sensor using active carrier confinement and post-process micromachining;" The $8^{th}$ International Conference on Solid-State Sensors and Acutators, Physical vol. 53, Issues 1-3; May 1996; pp. 278-283.
Petoussis et al.; "A Novel Hall Effect Sensor Using Elaborate Offset Cancellation Method;" Sensors & Transducers Journal, vol. 100, Issue 1; Jan. 2009; pp. 85-91.
Popovic; "Not-plate-like Hall magnetic sensors and their applications;" Sensors and Actuators A: Physical, vol. 85, Issues 1-3; Aug. 2000; pp. 9-17.
Roumenin et al.; "Vertical Hall Effect Devices in the Basis of Smart Silicon Sensors;" IEEE Workshop on Intelligent Data Acquisition and Advanced Computing Systems: Technology and Applications; Sep. 5-7, 2005; pp. 55-58.
Roumenin; "Magnetic sensors continue to advance towards perfection;" Sensors and Actuators A: Physical, vol. 46-47, Issues 1-3; Jan.-Feb. 1995; pp. 273-279.
Schneider et al.; "Temperature Calibration of CMOS Magnetic Vector Probe for Contactless Angle Measurement System;" International Electron Devices Meeting; Dec. 8-11, 1996; pp. 533-536.
SENSIMA technology sa; "CVHD: a new concept of Angular Position Sensor;" Slide Presentation for Allegro Microsystems; Mar. 2009; 17 sheets.
Sentron; AN-101; "Angular position sensing with 2-Axis Hall IC 2SA-10;" Feb. 12, 2004; http://www.diegm.uniud.it/petrella/Azionamenti%20Elettrici%20II/Sensori%20e%20transduttori/Data%20Sheet%20-%202SA-10.pdf; pp. 1-7.
Van der Meer; et al; "CMOS quad spinning-current Hall-sensor system for compass application;" IEEE Proceedings of Sensors, vol. 3; Oct. 24-27, 2004; pp. 1434-1437.
Vogelgesang et al.; Robert Bosch GmbH; "GMR sensors in automotive application;" CS-SNS/ECS Slides Presentation; Mar. 2, 2005; 16 sheets.
Volder; "The CORDIC Trigonometric Computing Technique;" The Institute of Radio Engineers, Inc.; IRE Transactions on Electronic Computers, vol. EC, Issue 3; Sep. 1959; pp. 226-230.
Banjevic; "High Bandwidth CMOS Magnetic Sensors Based on the Miniaturized Circular Vertical Hall Device;" Sep. 2011; 153 pages.
PCT Search Report of the ISA for PCT/US2014/011580 dated Jun. 24, 2014.
PCT Written Opinion of the ISA for PCT/US2014/011580 dated Jun. 24, 2014.
Schurig et al.; "CMOS Integrated Vertical Hall Sensor With Low Offset;" XVI The 16th European Conference on Solid-State Transducers; Prague, Czech Republic; Sep. 16-19, 2002; pp. 868-871.
International Search Report and Written Opinion dated Sep. 8, 2014 for PCT Application No. PCT/US2014/043770; 14 pages.
Analog Devices; "AD639: Universal Trigonometric Function Converter;" http://www.analog.com/en/obsolete/ad639/products/product.html; Jun. 1985; 13 pages.
Intersil; "ICL8038 Precision Waveform Generator/Voltage controlled Oscillator;" http://www.intersil.com/en/products/other-analog/special-analog/other-miscellaneous/ICL8038.html; downloaded Jan. 16, 2014; 13 pages.
U.S. Appl. No. 14/138,851, filed Dec. 23, 2013, Uberti et al.

(56) References Cited

OTHER PUBLICATIONS

U.S. Appl. No. 14/138,840, filed Dec. 23, 2013, Diaconu et al.
PCT Search Report and Written Opinion of ISA; for PCT Pat. App. No. PCT/US2014/069729; dated Feb. 18, 2015; 19 pages.
European Patent Office Rule 161 dated Sep. 22, 2015; For European Pat. App. No. 14702173.7-1560; 2 pages.
PCT International Preliminary Report on Patentability and Written Opinion of the ISA dated Aug. 27, 2015; For Pat. App. No. PCT/US2014/011580; 9 pages.
Office Action dated Jan. 13, 2016, For U.S. Appl. No. 13/947,608; 36 pages.
International Preliminary Report on Patentability dated Feb. 4, 2016 for PCT Application No. PCT/US2014/043770; 11 pages.
Response to Office Action dated Mar. 4, 2016 for U.S. Appl. No. 13/947,608, 9 pages.
Response dated Apr. 4, 2016 to Official Communication dated Sep. 22, 2015; For European Pat. App. No. 14702173.7; 3 pages.
Amended Specification and Claims dated Apr. 4, 2016; For European Pat. App. No. 14702173.7; 13 pages.

* cited by examiner

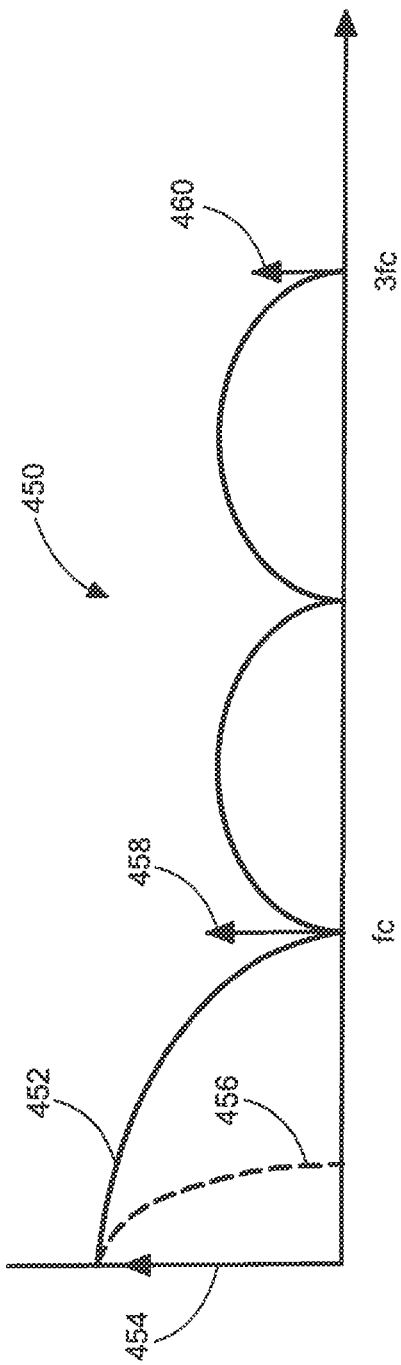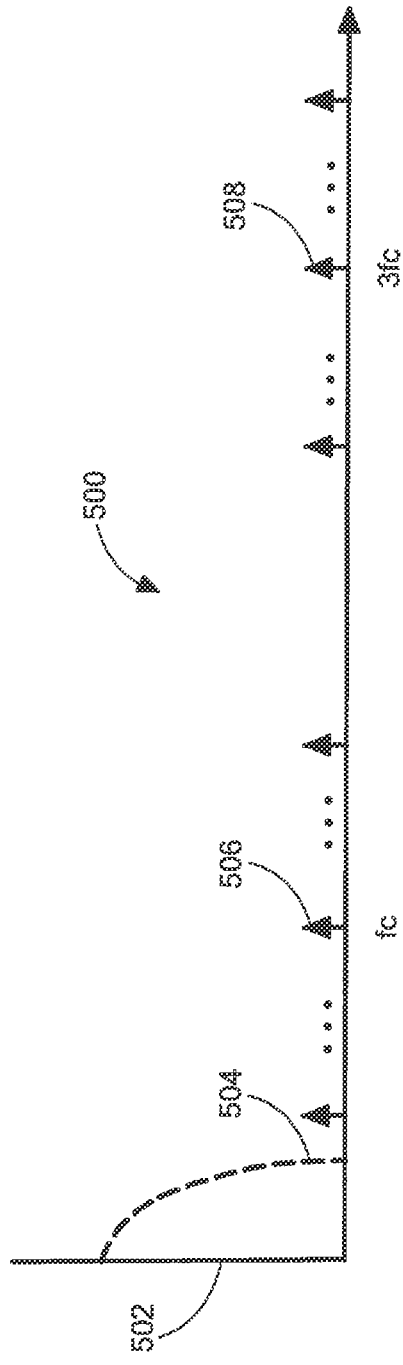

MAGNETIC FIELD SENSOR AND RELATED TECHNIQUES THAT PROVIDE AN ANGLE ERROR CORRECTION MODULE

CROSS REFERENCE TO RELATED APPLICATIONS

Not Applicable.

STATEMENT REGARDING FEDERALLY SPONSORED RESEARCH

Not Applicable.

FIELD

This invention relates generally to magnetic field sensors and, more particularly, to a magnetic field sensor that can provide an output signal representative of an angle of rotation of a target object, for which angular errors are reduced.

BACKGROUND

Magnetic field sensing elements can be used in a variety of applications. In one application, a magnetic field sensing element can be used to detect a direction of a magnetic field, i.e., and angle of the direction of the magnetic field.

Planar Hall elements and vertical Hall elements are known types of magnetic field sensing elements. A planar Hall element tends to be responsive to magnetic field perpendicular to a surface of a substrate on which the planar Hall element is formed. A vertical Hall element tends to be responsive to magnetic field parallel to a surface of a substrate on which the vertical Hall element is formed.

Other types of magnetic field sensing elements are known. For example, a so-called "circular vertical Hall" (CVH) sensing element, which includes a plurality of vertical Hall elements, is known and described in PCT Patent Application No. PCT/EP2008/056517, entitled "Magnetic Field Sensor for Measuring Direction of a Magnetic Field in a Plane," filed May 28, 2008, and published in the English language as PCT Publication No. WO 2008/145662, which application and publication thereof are incorporated by reference herein in their entirety. The CVH sensing element is a circular arrangement of vertical Hall elements arranged over a common circular implant and diffusion region in a substrate. The common implant and diffusion region can be a common epi (epitaxial) region (e.g., layer) upon a substrate, bounded by semiconductor isolation structures. The CVH sensing element can be used to sense a direction (i.e., an angle) (and optionally a strength) of a magnetic field in a plane of the substrate.

Various parameters characterize the performance of magnetic field sensing elements and magnetic field sensors that use magnetic field sensing elements. These parameters include sensitivity, which is a change in an output signal of a magnetic field sensing element in response to a change of magnetic field experienced by the magnetic sensing element, and linearity, which is a degree to which the output signal of the magnetic field sensing element varies in direct proportion to the magnetic field. These parameters also include an offset, which is characterized by an output signal from the magnetic field sensing element not representative of a zero magnetic field when the magnetic field sensing element experiences a zero magnetic field.

The above-described CVH sensing element is operable, with associated circuits, to provide an output signal representative of an angle of a direction of a magnetic field. Therefore, as described below, if a magnet is disposed upon or otherwise coupled to a so-called "target object," for example, a camshaft in an engine, the CVH sensing element can be used to provide an output signal representative of an angle of rotation of the target object.

The CVH sensing element is but one element that can provide an output signal representative of an angle of a magnetic field, i.e., an angle sensor. For example, an angle sensor can be provided from a plurality of separate vertical Hall elements or a plurality of magnetoresistance elements. Collectively, magnetic field sensing element(s) that generate an output signal related to an angle of a magnetic field are referred to herein "angle sensing elements."

More parameters can characterize the performance of and angle sensing element(s), e.g., a CVH sensing element. One such parameter is an angular accuracy of the output signal generated by the angle sensing element(s). Angular accuracy can have both an average angle error that is the same at all magnetic field pointing angles, and also an angle error that is different at different magnetic field angles (i.e. a non-linearity error). Another parameter is the speed with which the angle sensing element(s) can convey the angle of the magnetic field. It will be understood that the speed is particularly important for applications in which the angle of the magnetic field may be rapidly changing.

It is know that some parameters that can characterize an angle sensing element tend to change with temperature.

It would be desirable to provide circuits and techniques that can process output signals from an angle sensing element to provide an output signal that has a high degree of angle accuracy and a relatively high speed.

SUMMARY

The present invention provides circuits and techniques that can process output signals from an angle sensing element to provide an output signal that has a high degree of angle accuracy and a relatively high speed.

In accordance with one aspect, a magnetic field sensor includes a plurality of magnetic field sensing elements, each one of the plurality of magnetic field sensing elements is configured to generate a respective x-y output signal responsive to a magnetic field in an x-y plane. The magnetic field sensor also includes an angle processing circuit coupled to receive the x-y output signals and configured to generate an uncorrected x-y angle value representative of an angle of the magnetic field in an x-y plane. The uncorrected x-y angle value has a first angle error component. The magnetic field sensor also includes an angle error correction module coupled to the angle processing circuit and configured to generate an x-y angle value indicative of an error in the uncorrected x-y angle value. The magnetic field sensor also includes a combining module configured to combine the uncorrected x-y angle value with the x-y angle error value to generate a corrected x-y angle value having a second angle error component smaller than the first angle error component.

In accordance with another aspect, a method of reducing an error in a magnetic field sensor includes providing a plurality of magnetic field sensing elements. Each one of the plurality of magnetic field sensing elements is configured to generate a respective x-y output signal responsive to a magnetic field in an x-y plane. The method also includes using the x-y output signals to generate an uncorrected x-y angle value representative of an angle of the magnetic field in an x-y plane. The uncorrected x-y angle value comprises a first angle error component. The method also includes correcting the uncor-

BRIEF DESCRIPTION OF THE DRAWINGS

The foregoing features of the invention, as well as the invention itself may be more fully understood from the following detailed description of the drawings, in which:

FIG. 8 is a graph showing a frequency domain of operation of the magnetic field sensor of FIG. 7, when operated in a with repeating current spinning phase sequences; and FIG. 9 is a graph showing a frequency domain of operation of the magnetic field sensor of FIG. 7 when operated with varying current spinning phase sequences.

DETAILED DESCRIPTION

Figure 1:
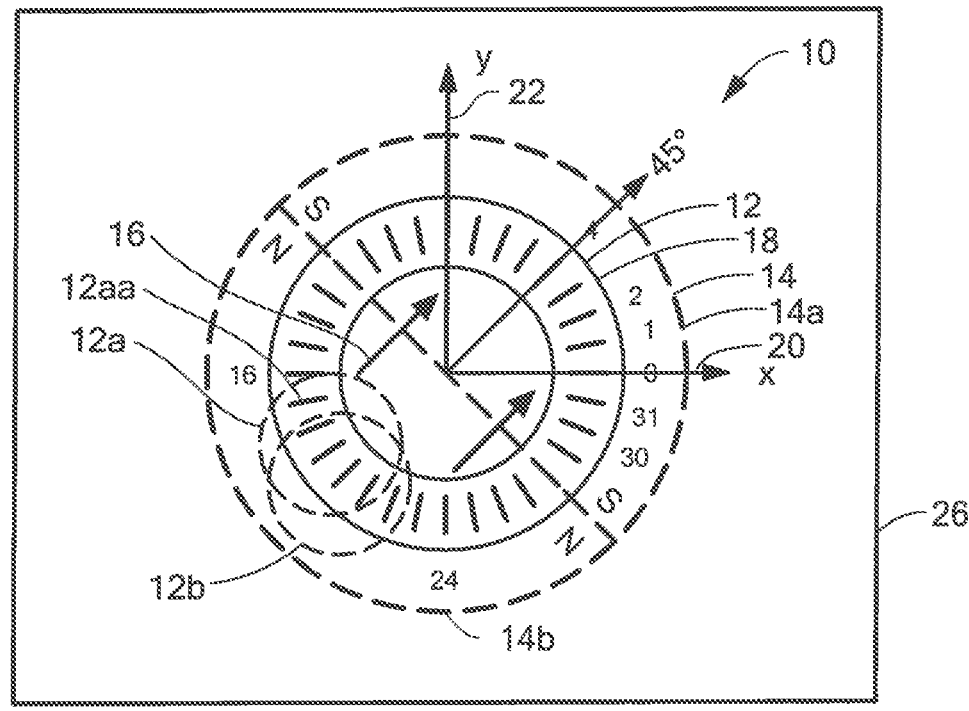
FIG. 1 is a pictorial showing a circular vertical Hall (CVH) sensing element having a plurality of vertical Hall elements arranged in a circle over a common implant region upon a substrate, and a two pole magnet disposed close to the CVH sensing element.

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a circular vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a compound, e.g., type III-V, semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

While a circular vertical Hall (CVH) element, which has a plurality of vertical Hall elements, is described in examples below, it should be appreciated that the same or similar techniques and circuits apply to any type of magnetic field sensing element(s) arranged in a manner to detect an angle of a pointing direction of a magnetic field, i.e., a rotation angle of a target object to which a magnet is attached.

Referring to FIG. 1, a circular vertical fall (CVH) element 12 includes a circular implant and diffusion region 18 in a substrate (not shown). The CVH sensing element 12 has a plurality of vertical Hall elements, of which a vertical Hall element 12a is but one example. In some embodiments, the common implant and diffusion region 18 can be characterized as a common epitaxial region upon a substrate, bounded by semiconductor isolation structures.

Each vertical Hall element has a plurality of Hall element contacts (e.g., four or five contacts), e.g., 12aa. Each vertical Hall element contact can be comprised of a metal contact over a contact diffusion region (a pickup) diffused into the common implant and diffusion region 18.

A particular vertical Hall element (e.g., 12a) within the CVH sensing element 12, which, for example, can have five adjacent contacts, can share some, for example, four, of the five contacts with a next vertical Hall element (e.g., 12b). Thus, a next vertical Hall element can be shifted by one contact from a prior vertical Hall element. For such shifts by one contact, it will be understood that the number of vertical Hall elements is equal to the number of vertical Hall element contacts, e.g., 32 or 64. However, it will also be understood that a next vertical Hall element can be shifted by more than one contact from the prior vertical Hall element, in which case, there are fewer vertical Hall elements than there are vertical Hall element contacts in the CVH sensing element.

As shown, a center of a vertical Hall element 0 can positioned along an x-axis 20 and a center of vertical Hall element 8 can be positioned along a y-axis 22. In the exemplary CVH sensing element 12, there are thirty-two vertical Hall elements and thirty-two vertical Hall element contacts. However, a CVH can have more than or fewer than thirty-two vertical Hall elements and more than or fewer than thirty-two vertical Hall element contacts.

In some applications, a circular magnet 14 having a north side 14b and a south side 14a can be disposed over the CVH 12. The circular magnet 14 tends to generate a magnetic field 16 having a direction from the north side 14b to the south side 14a, here shown to be pointed to a direction of about forty-five degrees relative to x-axis 20.

In some applications, the circular magnet 14 is mechanically coupled to a rotating target object, for example, an automobile steering shaft of an automobile camshaft, and is subject to rotation relative to the CVH sensing element 12. With this arrangement, the CVH sensing element 12, in combination with an electronic circuit described below, can generate a signal related to the angle of rotation of the magnet 14, i.e., an angle of rotation of the target object to which the magnet is coupled.

Figure 1A:
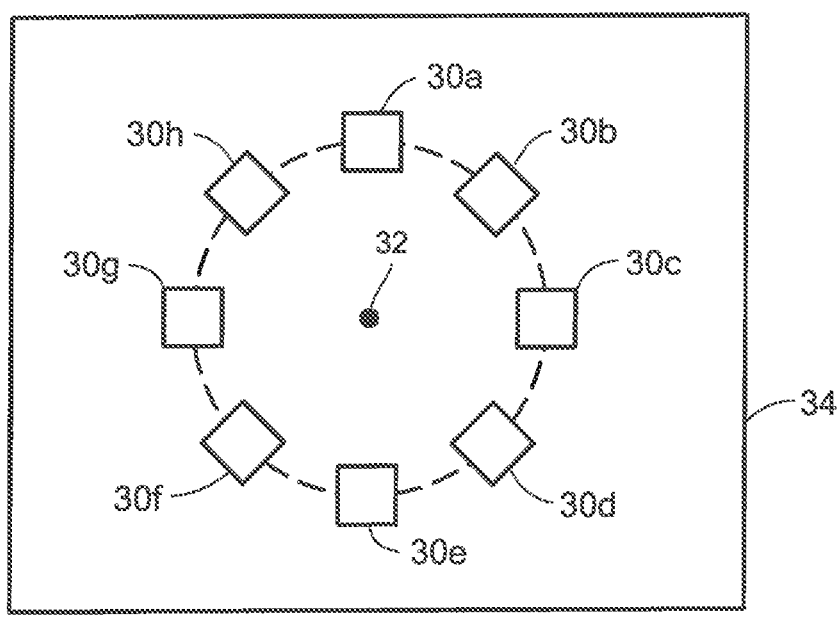
FIG. 1A is pictorial showing a plurality of magnetic field sensing elements.

Referring now to FIG. 1A, a plurality of magnetic field sensing elements 30a-30h, in a general case, can be any type of magnetic field sensing elements. The magnetic field sensing elements 30a-30h can be, for example, separate vertical Hall elements or separate magnetoresistance elements, each having an axis of maximum response parallel to a surface of a substrate 34. These magnetic field sensing elements can be coupled to an electronic circuit the same as or similar to electronic circuits described below in conjunction with FIGS. 3 and 6. There can also be a magnet the same as or similar to the magnet 14 of FIG. 1 disposed proximate to the magnetic field sensing elements 30a-30h.

Figure 2:
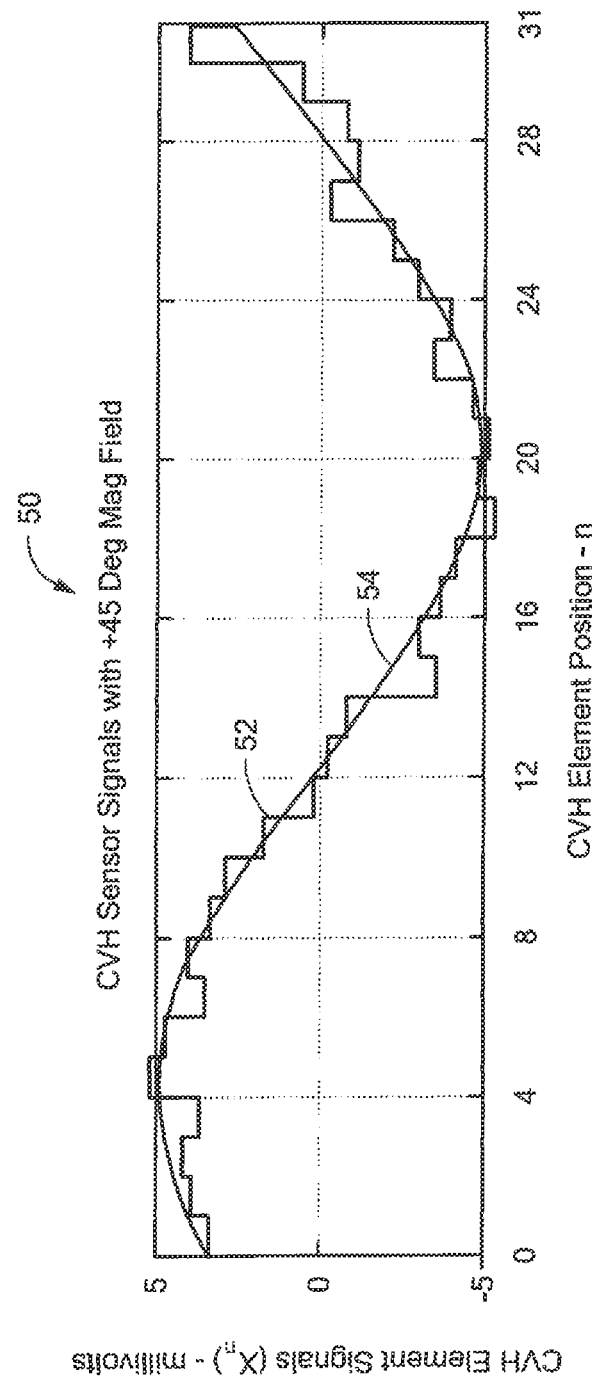
FIG. 2 is a graph showing an output signal as may be generated by the CVH sensing element of FIG. 1 or by the plurality of magnetic field sensing elements of FIG. 1A.

Referring now to FIG. 2, a graph 50 has a horizontal axis with a scale in units of CVH vertical Hall element position, n, around a CVH sensing element, for example, the CVH sensing element 12 of FIG. 1. The graph 50 also has a vertical axis with a scale in amplitude in units of millivolts. The vertical axis is representative of output signal levels from the plurality of vertical Hall elements of the CVH sensing element taken sequentially, one at a time, about the ring of contacts of the CVH sensing element.

The graph 50 includes a signal 52 representative of output signal levels from the plurality of vertical Hall elements of the CVH taken with the magnetic field of FIG. 1 pointing in a direction of forty-five degrees.

Referring briefly to FIG. 1, as described above, vertical Hall element 0 is centered along the x-axis 20 and vertical Hall element 8 is centered along the y-axis 22. In the exemplary CVH sensing element 12, there are thirty-two vertical Hall element contacts and a corresponding thirty-two vertical Hall elements, each vertical Hall element having a plurality of vertical Hall element contacts, for example, five contacts. In other embodiments, there are sixty-four vertical Hall element contacts and a corresponding sixty-four vertical Hall elements.

In FIG. 2, for the magnetic field 16 pointing at positive forty-five degrees, a maximum positive signal is achieved from a vertical Hall element centered at position 4, which is aligned with the magnetic field 16 of FIG. 1, such that a line drawn between the vertical Hall element contacts (e.g., five contacts) of the vertical Hall element at position 4 is perpendicular to the magnetic field. A maximum negative signal is achieved from a vertical Hall element centered at position 20, which is also aligned with the magnetic field 16 of FIG. 1, such that a line drawn between the vertical Hall element contacts (e.g., five contacts) of the vertical Hall element at position 20 is also perpendicular to the magnetic field.

A sine wave 54 is provided to more clearly show ideal behavior of the signal 52. The signal 52 has variations due to vertical Hall element offsets, which tend to cause corresponding variations of output signals causing them to be too high or too low relative to the sine wave 54, in accordance with offset errors for each element. The offset signal errors are undesirable.

Full operation of the CVH sensing element 12 of FIG. 1 and generation of the signal 52 of FIG. 2 are described in more detail in the above-described PCT Patent Application No. PCT/EP2008/056517, entitled "Magnetic Field Sensor for Measuring Direction of a Magnetic Field in a Plane," filed May 28, 2008, which is published in the English language as PCT Publication No. WO 2008/145662.

Groups of contacts of each vertical Hall element can be used in a chopped arrangement (also referred to herein as current spinning) to generate chopped output signals from each vertical Hall element. Thereafter, a new group of adjacent vertical Hall element contacts can be selected (i.e., a new vertical Hall element), which can be offset by one element from the prior group. The new group can be used in the chopped arrangement to generate another chopped output signal from the next group, and so on.

Each step of the signal 52 is representative of an unchopped output signal, i.e., from one respective group of vertical Hall element contacts, i.e., from one respective vertical Hall element. Thus, for a CVH sensing element having 32 vertical Hall elements taken sequentially, there are thirty-two steps in the signal 52 when current spinning is not used. However, for embodiments in which current spinning is used, each step of the signal 52 can be comprised of several sub-steps (not shown, e.g., four sub-steps), each sub-step indicative of a current spinning "phase."

Current spinning and current spinning phases are described more fully below in conjunction with FIGS. 4-4D.

It will be understood that a phase of the signal 52 is related to an angle of the magnetic field 16 of FIG. 1 relative to position zero of the CVH sensing element 12. It will also be understood that a peak amplitude of the signal 52 is generally representative of a strength of the magnetic field 16. Using electronic circuit techniques described above in PCT Patent Application No. PCT/EP2008/056517, or using other techniques described below, a phase of the signal 52 (e.g., a phase of the signal 54) can be found and can be used to identify the pointing direction of the magnetic field 16 of FIG. 1 relative to the CVH sensing element 12.

Figure 3:
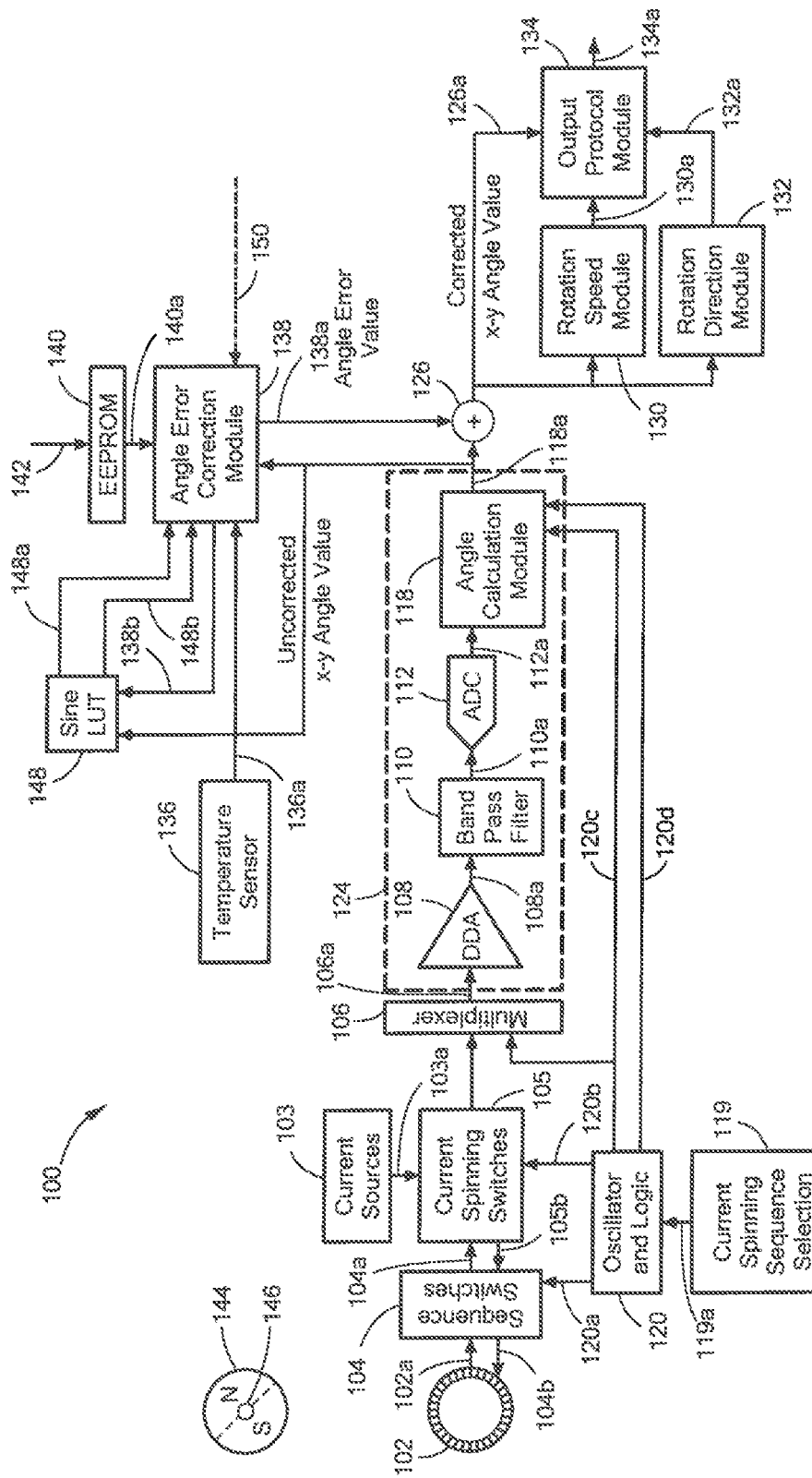
FIG. 3 is a block diagram of an exemplary magnetic field sensor having a CVH sensing element, having a current spinning sequence selection module configured to provide current spinning of vertical Hall elements within the CVH sensing element with variations of current spinning phase sequences, and also having an angle error correction module configured to estimate an angle error value that can be applied to reduce an angular error.

Referring now to FIG. 3, a magnetic field sensor 100 includes a CVH sensing element 102 having a plurality of vertical Hall elements, each vertical Hall element comprising a group of vertical Hall element contacts (e.g., five vertical Hall element contacts). In some embodiments, the CVH sensing element 102 can be the same as or similar to the CVH sensing element 12 described above in conjunction with FIG. 1, and can be disposed proximate to a two pole magnet 144 coupled to a target object 146, which magnet 144 can be the same as or similar to the magnet 14 of FIG. 1. However, in some embodiments, the CVH sensing element 102 can be replaced by a group of magnetic field sensing elements the same as or similar to those described above in conjunction with FIG. 1A.

The CVH sensing element 102 can be coupled to sequence switches 104 that sequence through the vertical Hall elements of the CVH sensing element 102 to provide an output signal 104a, which can be the same as or similar to the sequenced signal 52 of FIG. 2.

The CVH sensing element 102 can also be coupled to current spinning switches 105, which can be coupled to the CVH sensing element 102 via the sequence switches 104.

Current sources 103 can be configured to generate one or more current signals 103*a*. The current spinning switches 105 can be coupled to receive the one or more current signals 103*a* and to provide the current signals as signals 104*b* to the selected vertical Hall elements within the CVH sensing element 102.

As described above, current spinning, also referred to as chopping, is also process by which current sources, e.g., current sources 103, are sequentially coupled to different selected nodes of a selected vertical Hall element (selected via the sequence switches 104) within the CVH sensing element 102 using the current spinning switches 105. At the same time, and synchronously, the current spinning switches 105 provide couplings to selected output nodes of the selected vertical Hall element in accordance with so-called current spinning phase. Current spinning is further described below in conjunction with FIGS. 4-4D.

A current spinning sequence selection module 119 can generate a current spinning sequence control signal 119*a* received by an oscillator and logic module 120. The oscillator and logic module 120 can be coupled to provide a control signal 120*b* to the current spinning switches 105 to control current spinning phase sequences of selected ones of the vertical Hall elements of the CVH sensing element 102. The oscillator and logic 120 can also be coupled provide a control signal 120*a* to the sequence switches 104, to provide sequential selections of the vertical Hall elements within the CVH sensing element 102 and to provide the sequential output signal 104*a* from the vertical Hall elements of the CVH sensing element 102 in accordance with the selection.

In some embodiments, current spinning is not used.

A multiplexer 106 can be coupled to receive a signal 105*a*, with or without current spinning, from the CVH sensing element 102 via the sequences switches 104 and current spinning switches 105. The signal 105*a* can be the same as or similar to the sequential signal 52 of FIG. 2, or a similar signal that has current spinning, i.e., the above-described sub-steps.

The multiplexer 106 can also be coupled to receive a clock signal 102*c* from the oscillator and logic module 120.

The multiplexer is configured to generate a multiplexed output signal 106*a*, which, at some times, is representative of the signal 105*a*, and, at other times, is representative of the clock signal 120*c*.

For reasons that will be apparent from discussion above, a relative phase between the clock signal 120*c* and the signal 105*a* is representative of an angle of the magnetic field generated by the magnet 144 and sensed by the CVH sensing element 102.

A dual differential amplifier (DDA) 108 can be coupled to receive the multiplexed signal 106*a* and configured to generate an amplified signal 108*a*. A bandpass filter 110 can be coupled to receive the amplified signal 108*a* and configured to generate a filtered signal 110*a*. An analog-to-digital converter 112 can be coupled to receive the filtered signal 110*a* and configured to generate a converted signal 112*a*, a digital signal. An angle calculation module 118 can be coupled to receive the converted signal 112*a* and configured to generate an uncorrected x-y angle value 118*a* indicative of the angle of the magnetic field generated by the magnet 144, but with angle error more fully described below.

The angle calculation module 118 can also be coupled to receive clock signals 120*c*, 120*d* from the oscillator and logic module 120. The clock signal 120*d* can be a high speed clock signal.

The angle calculation module 118 is configured to compare relative phases of the signal 112*a*, which, at some times, is representative of an amplified and filtered version of the signal 105*a*, and, at other times, is representative of an amplified and filtered version of the clock signal 120*c*.

In operation, the uncorrected x-y angle value 118*a* can have a first angle error component. The first angle error component is described more fully below in conjunction with FIG. 5. Let it suffice here to say that the first angle error component is an angle error component that causes the uncorrected x-y angle value 118*a* to not be perfectly representative of the true angle of the magnetic field generated by the magnet 144.

An angle error correction module 138 is coupled to receive the uncorrected x-y angle value 118*a* and configured to generate an angle error value 138*a* indicative of the first error component within the uncorrected x-y angle value 118*a*. A combining module 126, here shown to be a summing node, can be coupled to receive the uncorrected x-y angle value 118*a*, coupled to receive the angle error value 138*a*, and configured to generate a corrected x-y angle value 126*a*. The corrected x-y angle value 126*a* can have a second angle error component that is smaller than the first angle error component of the uncorrected x-y angle value 118*a*. Thus, the corrected x-y angle value 126*a* is more accurately representative of the true angle of the magnetic field generated by the magnet 144.

The angle correction module 138 can also be coupled to receive a temperature signal 136*a* generated by a temperature sensor 136. The angle correction module 138 can also be coupled to receive sine values, here shown as two sine values 148*a*, 148*b*, from a sine look up table (LUT) 148. In some embodiments, the sine value 148*a* is representative of a sine value at a fundamental frequency the same as or related to a frequency of the signal 52 of FIG. 2, i.e., a frequency of the signal 104*a* and the signal 105*a*. In some embodiments, the sine value 148*b* is representative of a sine value at a second harmonic of the fundamental frequency. However, the sine look up table 148 can provide any number of sine values representative of any number of harmonics of the fundamental frequency. Sine values are described more fully below in conjunction with FIGS. 5 and 6.

The sine lookup table 148 can be coupled to receive, and can be indexed in accordance with, the uncorrected x-y angle value 118*a* and in accordance with so-called interpolated phase values 138*b* generated by angle error correction module 138. Interpolated phase values are further described below in conjunction with FIG. 6.

The magnetic field sensor 100 can be coupled to receive a control signal 142 from outside of the magnetic field sensor 100. In particular, an electrically erasable programmable read-only memory (EEPROM) can be coupled to receive the control signal 142 having one or more correction coefficients, and can be configured to supply the one or more correction coefficients to the angle correction module 138 as correction coefficients 140*a*.

Figure 6:
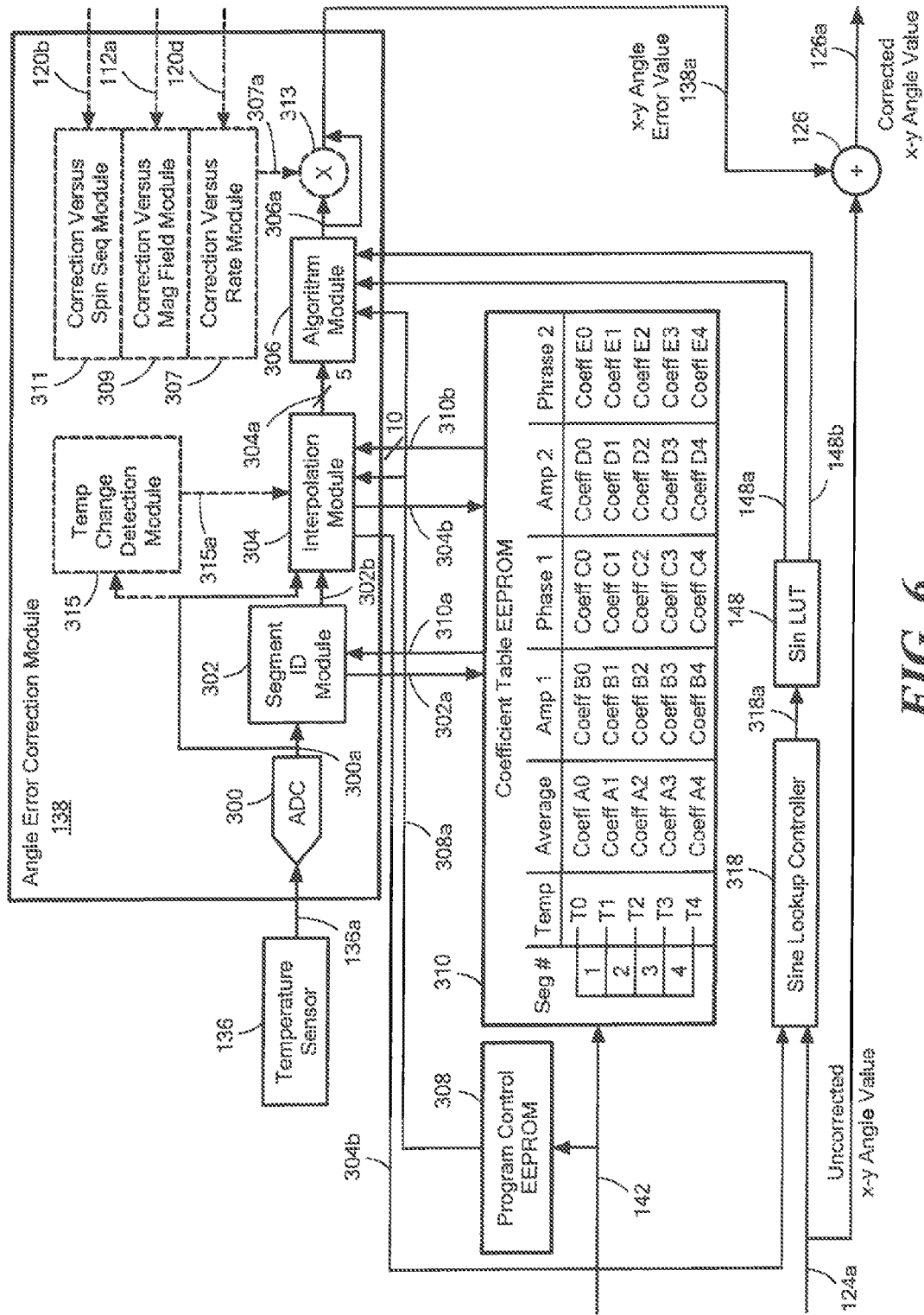
FIG. 6 is a block diagram showing further details of the angle error correction module of FIG. 3.

The angle correction module 138 is described in greater detail in conjunction with FIG. 6. However, let it suffice here to say that the angle correction module 138 is configured to use the temperature signal 136*a* to adjust the angle error value 138*a* according to the sensed temperature signal 136*a*.

The magnetic field sensor 100 can also include a rotation speed module 130 and/or a rotation direction module 132, each coupled to receive the corrected x-y angle value 126*a*. It will be understood that the corrected x-y angle value 126*a* can change, and therefore, can be representative of a rotating magnetic field when the magnet 144 rotates.

The rotation speed module 130 is configured to generate a rotation speed signal or value 130*a* indicative of a rotation speed of the magnet. The rotation direction module 132 is configured to generate a direction signal or value 132a indicative of a rotation direction of the magnet 144.

An output protocol module 134 is coupled to receive the corrected x-y angle value 126a, the ring rotation speed value 130a, and the rotation direction value 132a. The output protocol module 134 is configured to generate an output signal 134a representative of the angle of the magnetic field generated by the magnet 144, representative of the speed of rotation of the magnet 144, and representative of the direction of rotation of the magnet 144. The output signal 134a can be provided with the hope one of a variety of conventional formats, for example, an SPI format, a CAN format, an I2C format, or a Manchester format.

In some embodiments, the angle error correction module 138 can be coupled to receive one or more other control signals 150. The other control signals 150 are described more fully below in conjunction with FIG. 6. However, it will be appreciated that, by way of the one or more other control signals 150, the angle error correction module 138 can make adjustments to the angle error value 138a according to other characteristics of the magnetic field sensor 100.

Figure 4:
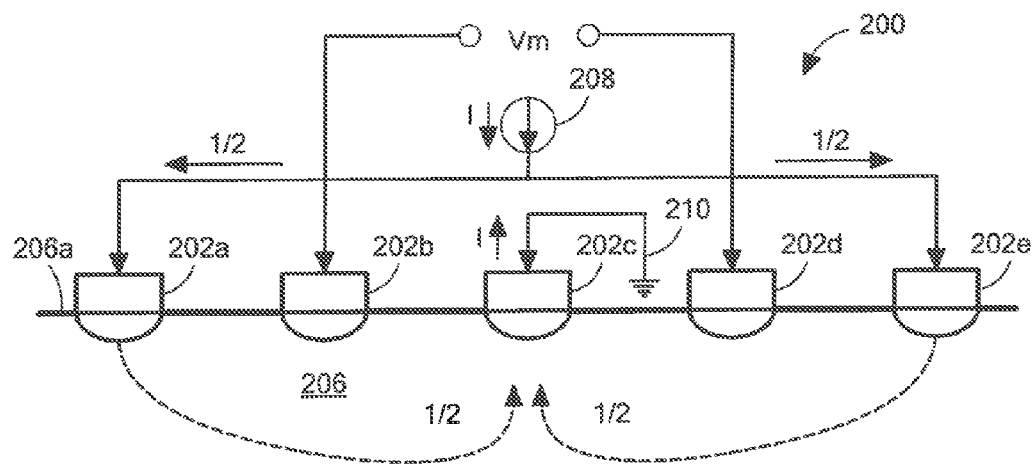
FIGS. 4-4C are block diagrams showing a vertical Hall element of the CVH sensing element of FIG. 3 when coupled into four current spinning phases, each phase associated with operation of one of the vertical Hall elements of the CVH sensing element of FIG. 3.
Figure 4A:
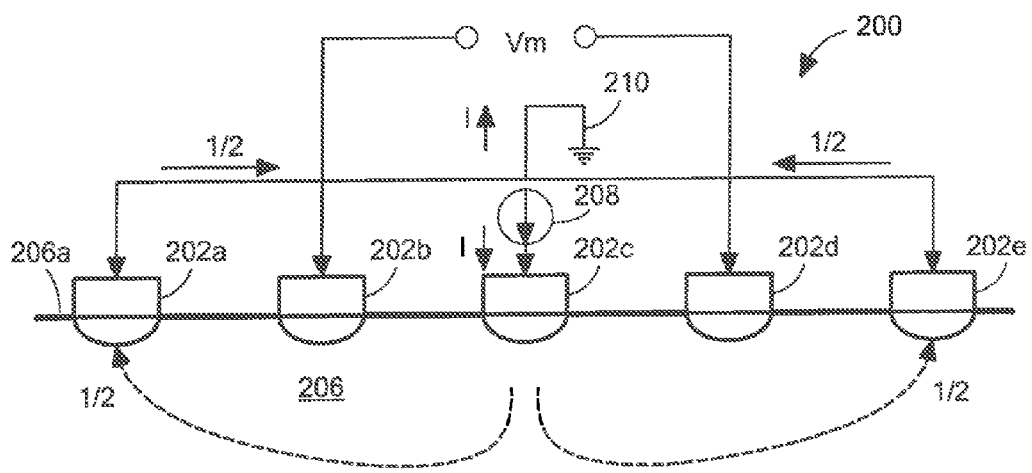
Figure 4B:
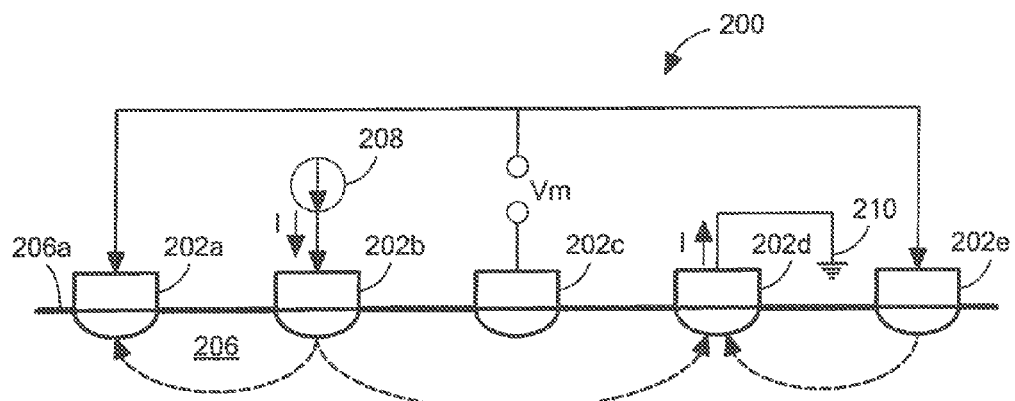
Figure 4C:
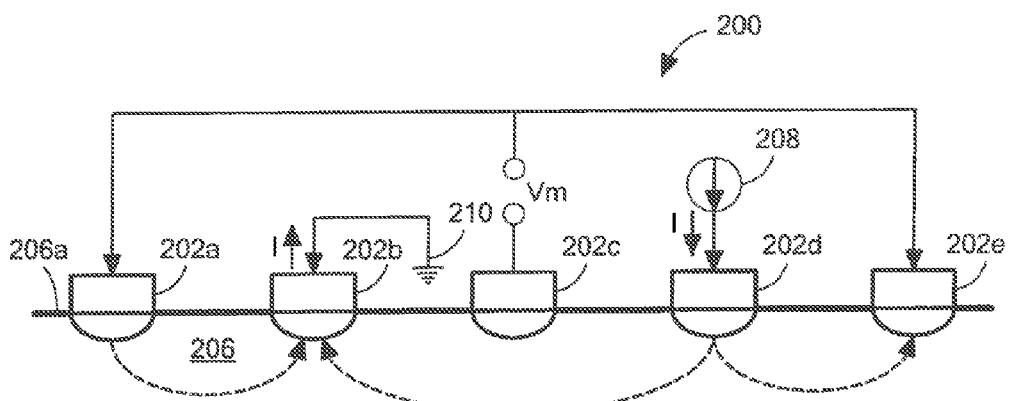

FIGS. 4-4C are representative of a four phase current spinning or chopping that can be used for a vertical Hall element having five contacts. Thus, it should be appreciated that such current spinning can be used for each selected vertical Hall element within the CVH sensing element 12 of FIG. 1 and the CVH sensing element 102 of FIG. 3. It should also be appreciated that such current spinning can also be used for separate magnetic field sensing elements, for example, the magnetic field sensing elements 30a-30h of FIG. 1A, where the magnetic field sensing elements 30a-30h are selected and chopped one of the time.

Referring now to FIG. 4, a vertical Hall element 200 of the CVH sensing element 102 of FIG. 3 is comprised of five vertical Hall element contacts, namely, first, second, third, fourth, and fifth vertical Hall element contacts, 202a, 202b, 202c, 202d, 202e, respectively. In a first chopping or current spinning phase, a current source 208, which can be the same as or similar to the current sources 103 of FIG. 3, can be coupled to the first and fifth vertical Hall element contacts 202a, 202e, respectively, which are coupled together, and can provide a total current of I, half of the current, I/2, flowing to the first vertical a Hall element contact 202a and half of the current, I/2, flowing to the fifth vertical Hall element contact 202c. The third vertical Hall element contact 202c is coupled to a voltage reference 210, for example, ground. Currents from the current source 208 flow from the first and fifth vertical Hall element contacts 202a, 202e, respectively, through a substrate 206 (e.g., through an epitaxial layer upon a substrate) of the CVH sensing element 200 to the third vertical Hall element contact 202c, as represented by dashed lines.

A signal, Vm, responsive to an external magnetic field, results between the second and fourth vertical Hall element contacts 202b, 202d, respectively. Thus, in the first current spinning phase, the current spinning switches 105 of FIG. 3 can select the second and fourth vertical Hall element contacts 202b, 202d to provide the output signal 105a, and can select the first, fifth, and third vertical Hall element contacts 202a, 202e, 202c, respectively, as those contacts coupled to the current sources 103 of FIG. 3. Couplings during other current spinning phases described below will be apparent.

Referring now to FIG. 4A, in which like elements of FIG. 4 are shown having like reference designations, in a second current spinning phase of the same vertical Hall element 200 (same five vertical Hall element contacts) of the CVH sensing element 102, couplings are changed by the current spinning switches 105 of FIG. 3. In the second phase, the current source 208 is coupled to the third vertical Hall element contact 202c, and the first and fifth vertical Hal element contacts 202a, 202e, respectively, are coupled together and to the reference voltage 210. Thus, the currents flow through the substrate 206 in opposite directions from those shown in FIG. 4.

As in FIG. 4, a signal, Vm, responsive to an external magnetic field, results between the second and fourth vertical Hall element contacts, 202b, 202d, respectively. The signal, Vm, of FIG. 4A is like the signal, Vm, of FIG. 4. However, the offset voltage within the signals can be different, e.g., different in sign.

Referring now to FIG. 4B, in which like elements of FIGS. 4 and 4A are shown having like reference designations, in a third current spinning phase upon the same vertical Hall element 200 (same five vertical Hall element contacts) of the CVH sensing element 102), couplings are again changed by the current spinning switches 105. In the third phase, the current source 208 is coupled to the second vertical Hall element contact 202b, and the fourth vertical Hall element contact 202d is coupled to the reference voltage 210. Thus, a current flows from the second vertical Hall element contact 202b through the substrate 206 to the fourth vertical Hall element contact 202d.

The first and fifth vertical Hall element contacts 202a, 202e, respectively, are coupled together. Some current also flows from the second vertical Hall element contact 202b through the substrate 206 to the first vertical Hall element contact 202a and through the mutual coupling to the fifth vertical Hall element contact 202e. Some current also flows from the fifth vertical Hall element contact 202e through the substrate 206 to the fourth vertical Hall element contact 202d.

A signal, Vm, responsive to an external magnetic field, results between the first vertical Hall element contact 202a first (and the fifth vertical Hall element contact 202e) and the third vertical Hall element contact 202c. The signal, Vm, of FIG. 4B is like the signal, Vm, of FIGS. 4 and 4A. However, the offset voltage within the signal can be different.

Referring now to FIG. 4C, in which like elements of FIGS. 4-4B are shown having like reference designations, in a fourth chopping phase upon the same vertical Hall element 200 (same five vertical Hall element contacts) of the CVH sensing element 102, couplings are again changed by the current spinning switches 105. In the fourth phase, the current is reversed from that shown in FIG. 4B. The current source 208 is coupled to the fourth vertical Hall element contact 202d, and the second vertical Hall element contact 202b is coupled to the reference voltage 210. Thus, a current flows from the fourth vertical Hall element contact 202d through the substrate 206 to the second vertical Hall element contact 202b.

The first and fifth vertical Hall element contacts 202a, 202c, respectively, are coupled together. Some current also flows from the fourth vertical Hall element contact 202d through the substrate 206 to the fifth vertical Hall element contact 202e, through the mutual coupling to the first vertical Hall element contact 202a. Some current also flows from the first vertical Hall element contact 202a through the substrate 206 to the second vertical Hall element contact 202b.

A signal, Vm, responsive to an external magnetic field, results between the first vertical Hall element contact 202a (and the fifth vertical Hall element contact 202e) and the third vertical Hall element contact 202c. The signal, Vm, of FIG. 4C is like the signal, Vm, of FIGS. 4-4B. However, the offset voltage within the signal can be different.

The signals, Vm, provided by the four phases of chopping of FIGS. 4-4C are responsive to an external magnetic field.

As described above, after generating the four current spinning phases on any one vertical Hall element within the CVH sensing element 102, by sequencing operation of the sequence switches 104 of FIG. 3, the current spinning arrangements of FIGS. 4-4C can move to a next vertical Hall element, e.g., five vertical Hall element contacts offset by one vertical Hall element contact from those shown in FIGS. 4-4C, and the four current spinning phases can be performed on the new vertical Hall element by operation of the current spinning switches 105 of FIG. 3.

However, in some embodiments, a sequence of phases (A, B, C, D) represented by the four current spinning phases of FIGS. 4-4C, can be changed in one of a variety of ways. For example, in some embodiments, the sequence of the (A, B, C, D) phases can be randomly selected for each one of the selected vertical Hall elements within the CVH sensing element 102. In some embodiments the random selection is fully random, and in some other embodiments, the random selection is a pseudo-random selection. In some embodiments, the random or pseudo random selection is within each rotation around the CVH sensing element, and in other embodiments, the random or pseudo random selection is among a plurality of rotations around the CVH sensing element.

In some other embodiments, the vertical Hall elements within the CVH sensing element 102 can be partitioned into at least two groups or sets of vertical Hall elements, wherein a first set of the vertical Hall elements uses a first sequence of current spinning phases, e.g., ABCD, and a second set of the vertical Hall elements uses a second different sequence of current spinning phases, e.g., CDAB each time the sequence switches 104 sequence around the CVH sensing element 102. There can be one or more vertical Hall elements within each one of the at least two sets of vertical Hall elements. Other variations of phase sequences are also possible, for example, using different phase sequences for any possible number of sets of vertical Hall elements, for example, three, four, five, or more, including twenty-four respective sets of vertical Hall elements, each time the sequence switches 104 sequence around the CVH sensing element 102.

In some embodiments, the above-described different sets of vertical Hall elements receive the above-described randomly or pseudo randomly selected phase sequences selected within each rotation around the CVH sensing element, and in other embodiments, the random or pseudo random selection is among a plurality of rotations around the CVH sensing element.

Thus, in general, there can be variations in, or differences in, the current spinning phase sequences among the plurality of vertical Hall elements within the CVH sensing element 102.

Reasons for selection of a different phase sequences among the vertical Hall elements of the CVH sensing element 102 are described more fully below in conjunction with FIG. 5.

Figure 5:
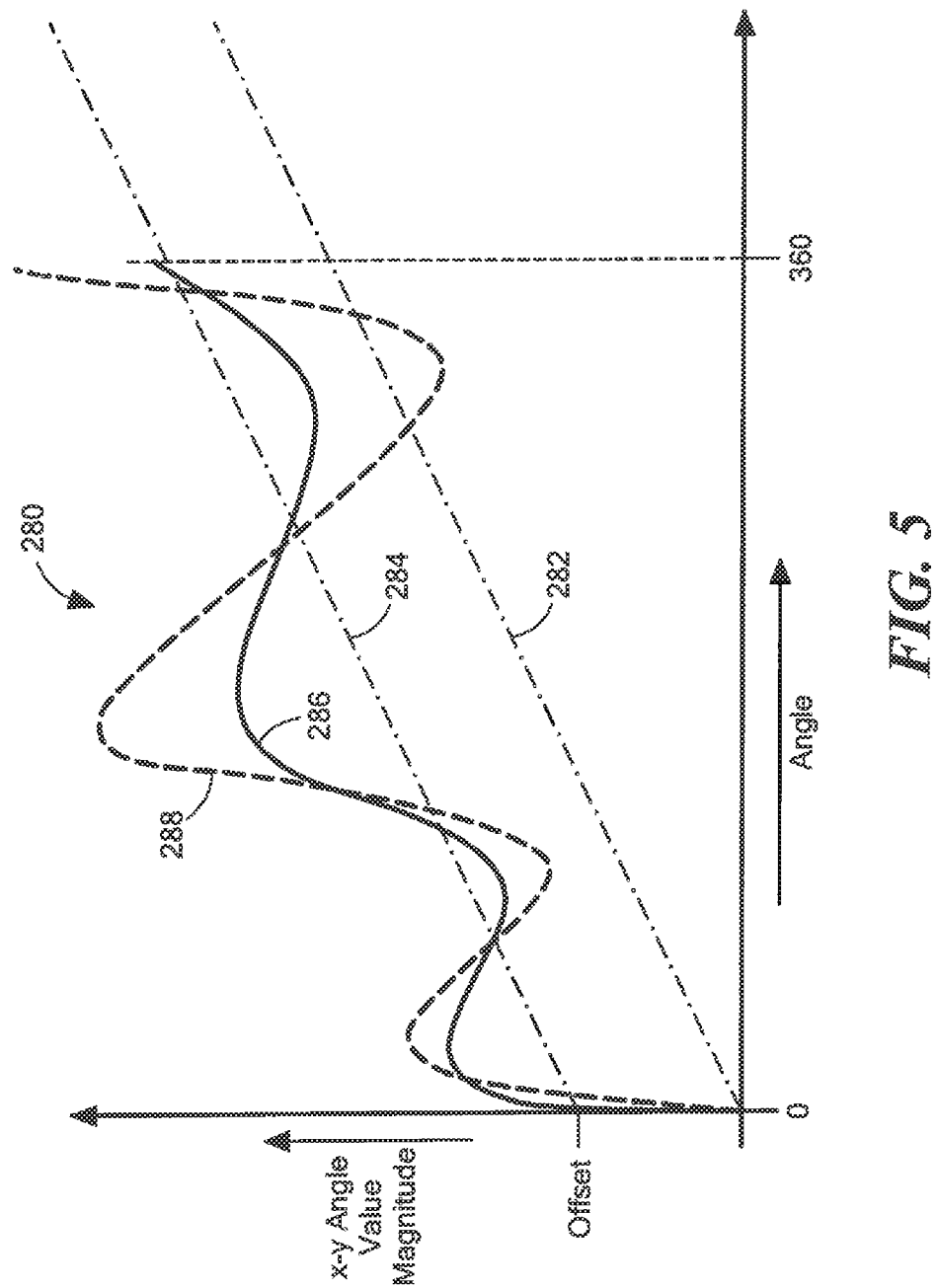
FIG. 5 is a graph showing ideal and non-ideal operation of the magnetic field sensor of FIG. 3.

Referring now to FIG. 5, a graph 280 has a horizontal axis with a scale in units of angular degrees and a vertical axis with a scale in units of value of an x-y angle value magnitude, for example, a magnitude of the uncorrected x-y angle value 118a of FIG. 3.

A line 282 is representative of an x-y angle value that has no angle error. When the x-y angle value has no angle error, the x-y angle value is perfectly linear with respect to actual angle, i.e., the x-y angle value is a perfect and true representation of the angle of the magnetic field generated by the magnet 144 of FIG. 3, and the line 282 passes through zero.

A line 284 is representative of an x-y angle value that has only an average or DC angle error, such that all angles represented by the x-y angle value are offset by a fixed number of degrees. The line 284 does not pass through zero.

A curve 286 is representative of an x-y angle value that has errors in representation of the true angle of the magnetic field generated by the magnet 14, average or DC errors and also an error that has a sinusoidal appearance.

A curve 288 is representative of an x-y angle value that has other errors in representation of the true angle of the magnetic field generated by the magnet 14.

A variety of circuit characteristics of the magnetic field sensor 100 contribute to the errors, i.e., to both the DC (or average) angle error represented by the curves 286, 288, and to the sinusoidal shapes of the curves 286, 288. One factor that contributes to the errors is switching noise generated by the sequence switches 104 and/or by the current spinning switches 105 of FIG. 3.

First, regarding the sequence switches 104, it will be understood that charge injection or switching spikes (together referred to as noise) generated by the sequence switches 104 are not necessarily exactly the same as each sequential vertical Hall element is selected in the CVH sensing element 102. When the noise generated by the sequence switches 104 is not the same as each vertical Hall element is selected, a DC (or average) angle error is generated and also a sinusoidal type error such as that represented by the curves 286, 288. The sinusoidal error characteristic can be, in part, a result of the noise generated by the sequence switches being repetitive for each cycle around the CVH sensing element 102, and thus, the noise will have an angle error frequency component at a frequency of the signal 52 of FIG. 2, and will add to the signal 52 (104a of FIG. 3). The angle error frequency component is essentially fixed in phase relative the signal 104a, and therefore, the addition of the angle error causes different phase shift errors in the summed signal depending on the phase of the signal 104a. Higher harmonics can also result from the noise.

Next, regarding the current spinning switches 105, it will be understood that charge injection or switching spikes (together referred to as noise) generated by the current spinning switches 105 are not necessarily exactly the same as each sequential vertical Hall element is selected in the CVH sensing element 102. When the noise generated by the current spinning switches 105 is not the same as each vertical Hall element is selected, a DC (or average) angle error is generated and also a sinusoidal type error such as that represented by the curves 286, 288. The sinusoidal error characteristic can, in part, result from the noise generated by the current spinning switches 105 being repetitive for each cycle around the CVH sensing element. However, by techniques described herein, phase sequences of the vertical Hall elements within the CVH sensing element 102 can be varied, and thus, the noise generated by the current spinning switches 105 need not be repetitive for each cycle around the CVH sensing element, and corresponding angle error is reduced.

Other circuit characteristics can also contribute to the angle errors, i.e., to both the DC (or average) angle error represented by the error curves 286, 288, and to the sinusoidal shapes of the error curves 286, 288. Namely, a speed with which the dual differential amplifier 108 of FIG. 3, and also other circuit elements of FIG. 3, are unable to settle to final values as the sequence switches 104 switch among the vertical Hall elements of the CVH sensing element 102, and also as the current spinning switches 105 switch among the various current spinning phases, contribute to the errors.

The above-described circuit characteristics, including, but not limited to, switching noise and lack of circuit elements settling to final values, tend to be influenced by (i.e., changed by) a variety factors including, but not limited to, temperature of the magnetic field sensor 100 of FIG. 2, rate of sequencing around the CVH sensing element 102, peak magnitude of the magnetic field experience by the CVH sensing element 102 as the magnet 144 rotates, and selected current spinning sequence(s) among the various vertical Hall elements.

Differences between the curves 286, 288 can be attributed to changes in the same factors, namely, changes in the temperature, changes in or differences in peak amplitude of the magnetic field experience by the CVH sensing element 102 as the magnet 144 rotates, changes in or differences in rates of sequencing around the CVH sensing element 102, and changes in or differences in selected current spinning sequence(s) among the various vertical Hall elements within the CVH sensing element 102. Among these factors, it will be understood that the changes in the temperature can occur at any time. The changes in the peak amplitude of the magnetic field can be influenced by positional changes, i.e., air gap changes, between the magnet 144 and the CVH sensing element 102 of FIG. 3. The changes in the peak amplitude of the magnetic field can also be influenced by mechanical considerations, for example, wear of a bearing or a shaft upon which the magnet 144 rotates. However, the changes in sequencing rates and the changes in current spinning sequences can be fixed, and changed only for different applications of the magnetic field sensor 100.

In general, it has been determined that the dominant angle error frequency components occur at first and second harmonics of the frequency of the signal 52 (i.e., 104a or 105a). The curves 286, 288 are representative of angle error functions dominated by first and second harmonics of the frequency of the signal 52 (104a).

The angle error correction module 138 of FIG. 3 is configured to make changes to angle error corrections it applies according to at least the temperature contribution to the angle error represented by the curves 286, 288. In some embodiments, the angle error correction module 138 is also configured to make changes to the angle error corrections according to one or more of the other above-described factors that contribute to the difference between the curves 286, 288.

As described herein, angle errors represented by the curves 286, 288 are referred to as first error characteristics, each influenced by the above factors.

As also described herein, the angle correction module 138 of FIG. 3 can be used to generate the angle error value 138a, which can be used to generate the corrected x-y angle value 126a. Accordingly, other angle error curves (not shown) with lower peak to peak variation than the error curves 286, 288 are representative of second error characteristics that are smaller than the first error characteristics.

The error curves 286, 288 can be mathematically described in the following way.

Mathematically, the angle error represented by the curves 286, 288 can be represented as:

$$\alpha_{err} = \text{OFF} + DC(T) + \sum_{n=1}^{\infty} H_{nA}(T) \cdot \sin(n\alpha + H_{nP}(T)) \quad (1)$$

where:
α=measured angle with error (see uncorrected x-y angle value 118a of FIG. 3);
n=a variable indicative of an nth harmonic;
T=temperature measured by temperature sensor 136;
OFF=a magnetic target positioning error, i.e., a mechanical misalignment of the CVH sensing element 102 in relation to the magnet 144 of FIG. 3, which is usually independent of the temperature, T;
DC(T)=an average of DC angle error, which is a function of the temperature, T;
$H_{nA}(T)$=an amplitude of an nth-harmonic component of the error, which is a function of the temperature, T; and
$H_{nP}(T)$=a phase of the nth-harmonic component, which is a function of the temperature, T.

Other factors described above, other than temperature, which affect the angle error, are not taken into account in equation 1. Namely, the rate of sequencing around the CVH sensing element 102 is not taken into account, the peak amplitude of the magnetic field experienced by the CVH sensing element 102 and generated by the magnet 144 is not taken into account, and the current spinning phase sequence generated by the current spinning sequence selection module 119 is not taken into account in the above expression.

An estimated and quantized angle error (rather than non-quantized error of equation (1)) can be mathematically expressed as:

$$\alpha'_{err} = \text{OFF} + DC_q(T) + \sum_{n=1}^{\infty} H_{nA\_q}(T) \cdot \sin(n\alpha + H_{nP\_q}(T)) \quad (2)$$

where:
q stands for quantized values.

It is described below in conjunction with FIG. 6 that the angle error correction module 138 of FIG. 3 can use a set of programmable average correction coefficients, programmable amplitude correction coefficients, and programmable phase correction coefficients stored within the EEPROM 140 of FIG. 3 in an expression the same as or similar to the expression of equation (2). As described below, in some embodiments, the misalignment correction coefficient, OFF, can also be stored and used.

The angle error correction module 138 of FIG. 3 can digitally weight, in accordance with the correction coefficients, one or more normalized sine waveforms (values) (i.e., one or more harmonic values) provided by the sine LUT 148, the results of which are summed together in order to approximate the angle error according to equation (2). Thus, in some embodiments, the angle error correction module 138 of FIG. 3 can generate the angle error value 138a according to equation (2).

In some embodiments, the error correction module 138 evaluates equation (2) using two harmonics, first and second. In some other embodiments, the error correction module 138 evaluates equation (2) with one harmonic, first or second. In some other embodiments, the error correction module 138 evaluates equation (2) with more than two harmonics, for example, first, second, third, fourth, and fifth harmonics. In some other embodiments, the error correction module 138 evaluates equation (2) also using also the average value, $DC_q$(T). In some other embodiments, the error correction module 138 evaluates equation (2) using only the average value, $DC_q$(T), without any sine functions or harmonics, and with or without the misalignment correction coefficient, OFF. In some embodiments, the error correction module 138 evaluates an equation different from equation (2), but having correction coefficients that can be stored in the coefficient table EEPROM 310.

As described above in conjunction with FIG. 3, the combining module 126 is operable to combine the angle error value (i.e., the estimated error according to equation (2)), which is temperature dependent, with the uncorrected x-y angle value 118a. Thus, for each temperature $T_i$, the estimated error, $\alpha'_{err}$, for measured angle α according to equation (2) can be digitally subtracted from (or added to) the sensed (i.e., measured) angle, α, (i.e., the uncorrected x-y angle value 118a of FIG. 2), which contains an error represented by the curves 286, 288 of FIG. 5.

As temperature varies, each harmonic component of the angle error represented by equation (2) can change independently in amplitude and phase. As described below in conjunction with FIG. 6, in some embodiments, angle error variations as a function of temperature of each parameter (average, and also amplitude and phase of each harmonic component) are approximated between pairs of stored average, amplitude, and phase values using a piecewise-linear interpolation.

Variation in current spinning phase sequences is described above in conjunction with FIG. 3. An angle error correction module is also described above in conjunction with FIGS. 3 and 5. It should be apparent that both a proper selection of the variation of the current spinning phase sequences and the use of the angle error correction module tend to reduce a magnitude of the angle error represented by the curves 286, 288. It should be appreciated that the two techniques can be used separately or together to achieve a reduction in angle error of the magnetic field sensor 100.

Referring now to FIG. 6, in which like elements of FIG. 3 are shown having like reference designations, the angle error correction module 138 can coupled to a coefficient table EEPROM 310. The coefficient table EEPROM 310 is configured to store a plurality of correction coefficients of values associated with the above equation (2), and associated with so-called temperature segments. The coefficient table EEPROM 310 can be part of the EEPROM 140 of FIG. 3.

As used herein, the term "temperature segment" is used to describe one of a plurality of temperature ranges, each temperature range bounded by a pair of temperatures. Examples shown herein and described below use four such temperature segments, a first temperature segment adjacent to the second temperature segment, the second temperature segment adjacent to a third temperature segment, and a fourth temperature segment adjacent to the third temperature segment, in ascending order of temperatures. In some embodiments the temperature segments overlap, and, in other embodiments, there are temperature spaces between the temperature segments. In some embodiments, each temperature segment spans the same number of degrees of temperature, and in other embodiments the temperature segments span different numbers of degrees of temperature. For example, in some embodiments the second and third temperature segments can each have wider temperature span than the first and fourth segments.

The coefficient table EEPROM 310 can store therein a plurality of temperature values, e.g., T0, T1, T2, T3, T4, T5, representative of boundaries of four temperature segments.

The coefficient table EEPROM 310 can also store therein a plurality of correction coefficients. For example, the coefficient table EEPROM 310 can store five average correction coefficients, Coeff A0, Coeff A1, Coeff A2, Coeff A3, Coeff A4. Each of the five average correction coefficients is representative of an average value, $DC_q(T)$, in equation (2), at a different respective temperature corresponding to temperatures at the boundaries of the four temperature segments.

In some embodiments, the coefficient table EEPROM 310 can also store five first harmonic amplitude correction coefficients, Coeff B0, Coeff B1, Coeff B2, Coeff B3, Coeff B4. Each of the five first harmonic amplitude correction coefficients is representative of the amplitude value, $H_{nA\_q}(T)$, in equation (2) for n=1, i.e., for the first harmonic of the error signals 286, 288 of FIG. 5, at a different respective temperature corresponding to temperatures at the boundaries of the four temperature segments.

In some embodiments, the coefficient table EEPROM 310 can also store five first harmonic phase correction coefficients, Coeff C0, Coeff C1, Coeff C2, Coeff C3, Coeff C4. Each of the five first harmonic phase correction coefficients is representative of the phase value, $(H_{nP\_q}(T))$, in equation (2) for n=1, i.e., for the first harmonic of the error signals 286, 288 of FIG. 5, at a different respective temperature corresponding to temperatures at the boundaries of the four temperature segments.

In some embodiments, the coefficient table EEPROM 310 can also store five second harmonic amplitude correction coefficients, Coeff D0, Coeff D1, Coeff D2, Coeff D3, Coeff D4. Each of the five second harmonic amplitude correction coefficients is representative of the amplitude value, $H_{nA\_q}(T)$, in equation (2) for n=2, i.e., for the second harmonic of the error signals 286, 288 of FIG. 5, at a different respective temperature corresponding to temperatures at the boundaries of the four temperature segments.

In some embodiments, the coefficient table EEPROM 310 can also store five second harmonic phase correction coefficients, Coeff E0, Coeff E1, Coeff E2, Coeff E3, Coeff E4. Each of the five second harmonic phase correction coefficients is representative of the phase value, $(H_{nP\_q}(T))$, in equation (2) for n=2, i.e., for the second harmonic of the error signals 286, 288 of FIG. 5, at a different respective temperature corresponding to temperatures at the boundaries of the four temperature segments.

In some embodiments, the coefficient table EEPROM 310 can also store the misalignment correction coefficient, OFF, (not shown) representative of the above described mechanical misalignment of the CVH sensing element 102 with the magnetic field generated by the magnet 144 of FIG. 3.

In some embodiments, all of the stored correction coefficients and values can be programmed into the coefficient table EEPROM 310, for example, by way of the control signal 142.

As described above, while four temperature segments and associated temperatures and coefficients are shown, in other embodiments, there can be more than or fewer than four temperature segments, and more than or fewer than thirty stored coefficients in accordance with a number of temperature segments. Also, in accordance with that described above, while coefficients representative of temperatures, coefficients representative of average values, coefficients representative of amplitude and phase values of the first harmonic, and coefficients representative of amplitude and phase values of the second harmonic of the error curves 286, 288 of FIG. 5 are shown, in other embodiments, fewer than those coefficients can be stored and used. However, in still other embodiments coefficients representative of even higher harmonics can be stored and used, for example, by way of equation (2).

The angle error correction module 138 can include an analog-to-digital converter 300 coupled to receive the temperature signal 136a from the temperature sensor 136. The analog-to-digital converter 300 is configured to generate a converted signal 300a, which is a digital signal representative of the temperature of the magnetic field sensor 100.

The angle error correction module 138 can include a segment identification module 302 coupled to receive the digital temperature signal 300a and configured to identify one of a plurality of temperature segments in which the digital temperature signal 300a lies. To this end, the segment identification module 302 can receive information 310a about the stored temperature segments, e.g., temperature boundaries T0, T1, T2, T3, T4, T5 of four stored four temperature segments, from the coefficient table EEPROM 310. The segment identification module 302 is operable to identify between which two adjacent temperatures the digital temperature signal 300a lies, i.e., within which one of the four temperature segments the digital temperature signal 300a lies. In accordance with the identified temperature segment, the segment identification module is operable to generate a segment identifier signal 302b representative of the identified temperature segment.

The angle error correction module 138 can also include an interpolation module 304 coupled to receive the digital temperature signal 300a and coupled to receive the segment identifier signal 302b. The interpolation module 304 is also coupled to receive identified coefficients 310b, identified by the segment identification module 302.

In accordance with the segment identifier signal 302b, the interpolation module is configured to generate a correction coefficient request signal 304b received by the coefficient table EEPROM 310. In response to the correction coefficient request signal 304b, the coefficient table EEPROM provides a plurality of correction coefficients 3100b associated with the temperature boundaries of the identified temperature segment. It will be understood that identification of the temperature segment results in selection of ten correction coefficients, five correction coefficients at the temperature of each one of the boundaries of the identified temperature sites.

The interpolation module 304 is operable to interpolate between pairs of the identified and received correction coefficients 310b. For example, if the digital temperature signal 300a is representative of a temperature of two hundred fifty degrees, and if the pair of average value correction coefficients, e.g., Coeff A2, Coeff A3 are correction coefficients associated with a temperature segment spanning from two hundred degrees to three hundred degrees (i.e., a third temperature segment in which the digital temperature signal 300a lies), then it should be apparent that the interpolation module can interpolate between the two correction coefficients, Coeff A2, Coeff A3, to arrive at an interpolated correction coefficient. Similar interpolations can be performed by the interpolation module 304 between other ones of the pairs of correction coefficients associated with the third temperature segment to generate a plurality of interpolated correction coefficients 304a In some embodiments, the interpolation module 304 can perform linear interpolations.

In other embodiments the interpolation module 314 can perform nonlinear interpolations. In some embodiments, the interpolation module 304 can perform a type of interpolation appropriate for a width of a temperature segment. For example, if a width of the identified temperature segment is relatively wide, then the interpolation module 304 can perform a linear interpolation where the digital temperature signal 300a falls within that wide temperature segment. Conversely, if a width of the identified temperature segment is narrow, which may be indicative of a rapidly changing error characteristic, and the interpolation module 304 can perform a nonlinear interpolation where the digital temperature signal 300a falls within that narrower temperatures segment.

The angle error correction module 138 can also include an algorithm module 306 coupled to receive the interpolated correction coefficients 304a and configured to use the interpolated correction coefficients 304a in an algorithm, for example, an algorithm that uses equation (2) above. As described above, the algorithm module 306 can employ equation (2) with any number of harmonics and with or without the average or DC correction coefficients.

The algorithm module 306 is configured to generate an x-y angle error value 306a. In some embodiments, the x-y angle error value 306a bypasses an optional combining module 313, and becomes the x-y angle error value 138a described above in conjunction with FIG. 3.

As described above in conjunction with FIG. 3, a combining module 126 can be coupled to receive the x-y angle error value 138a, coupled to receive the uncorrected x-y angle value 124a, and configured to combine the two values to generate the corrected x-y angle value 126a that is more accurate and has a smaller (i.e., a second) error component smaller than the first error component of the uncorrected x-y angle value 124a.

The sine look up table 148 is described above in conjunction with FIG. 3. The sine lookup table 148 can provide first and second harmonics sine values 148a, 148b, respectively, to the algorithm module 306 for use in evaluating equation (2) above.

A sine lookup controller 318 can be coupled to receive the uncorrected x-y angle value 124a, and coupled to receive interpolated phase values 304b from the interpolation module. It will be apparent from equation (2) that both of these values are required in order to know how to index into the sine lookup table 148. In particular, the parameter $\sin(na+H_{nP\_q}(T))$ of equation (2) requires an index including both the measured (i.e., uncorrected) angle, $\alpha$, and an interpolated phase, $H_{nP\_q}(T)$. Recall that the parameter n is a harmonic number.

In some embodiments, the angle error correction module 138 can optionally include a temperature change detection module 315 coupled to receive the digital temperature signal 300a and configured to identify if the digital temperature signal 300a is representative of a change in temperature or representative of no change temperature. The temperature change detection module can be configured to generate a control signal 315a also indicative of a change in temperature or indicative of no change in temperature. Accordingly, in some embodiments, the interpolation module 304 can perform the above described interpolations and provide new interpolated correction coefficients 304a only when the control signal 315a is indicative of a change in temperature. At other times, the algorithm module can use interpolated correction coefficients that were previously calculated.

In some embodiments, the angle error correction module 138 can include one or more of a correction versus current spinning sequence module 311, a correction versus magnetic field amplitude module 309, or a correction versus sequence rate module 307.

In response to a clock signal 120b, the correction versus current spinning sequence module 311 is configured to identify a correction factor related to the selected sequence of current spinning phase sequence groups that can be applied to further improve the x-y angle error value 138a. In response to the signal 112a from the analog-to-digital converter 112 of FIG. 3, the correction versus magnetic field amplitude module 309 is configured to identify a correction factor related to the amplitude of the magnetic field experience by the CVH sensing element 102 and can be applied to further improve the x-y angle error value 138a. In response to the clock signal 120d, the correction versus sequence rate module 307 is configured to identify a correction factor related to the rate at which a vertical Hall elements within the CVH sensing element 102 of FIG. 3 are sequenced, which correction factor can be applied to further improve the x-y angle error value 138a.

Collectively, a correction value 307a includes one or more of the above correction factors. The correction value 307a can be received by a combining module 313, and can be applied to the x-y angle error value 306a, so that the corrected x-y angle value 126a will have a third error component, which is smaller than the above-described first and second error components. In other words, the corrected x-y angle value 126a is still more truly representative of an actual angle.

In some embodiments a program control EEPROM 308 can be coupled to receive the control signal 142. The program control EEPROM 308 can be coupled to one or more of the interpolation module 304 or the algorithm module 306. In some embodiments, by way of the control signal 142, a user can program the magnetic field sensor 100 of FIG. 3 to use a selected type of interpolation within the interpolation module. In some embodiments, by way of the control signal 142, a user can program the magnetic field sensor 100 of FIG. 3 to use a selected type of algorithm within the algorithm module 306. Thus, in some embodiments, the magnetic field sensor 100 uses equation (2) as the algorithm, and in other embodiments, the magnetic field sensor uses a different algorithm.

Figure 7:
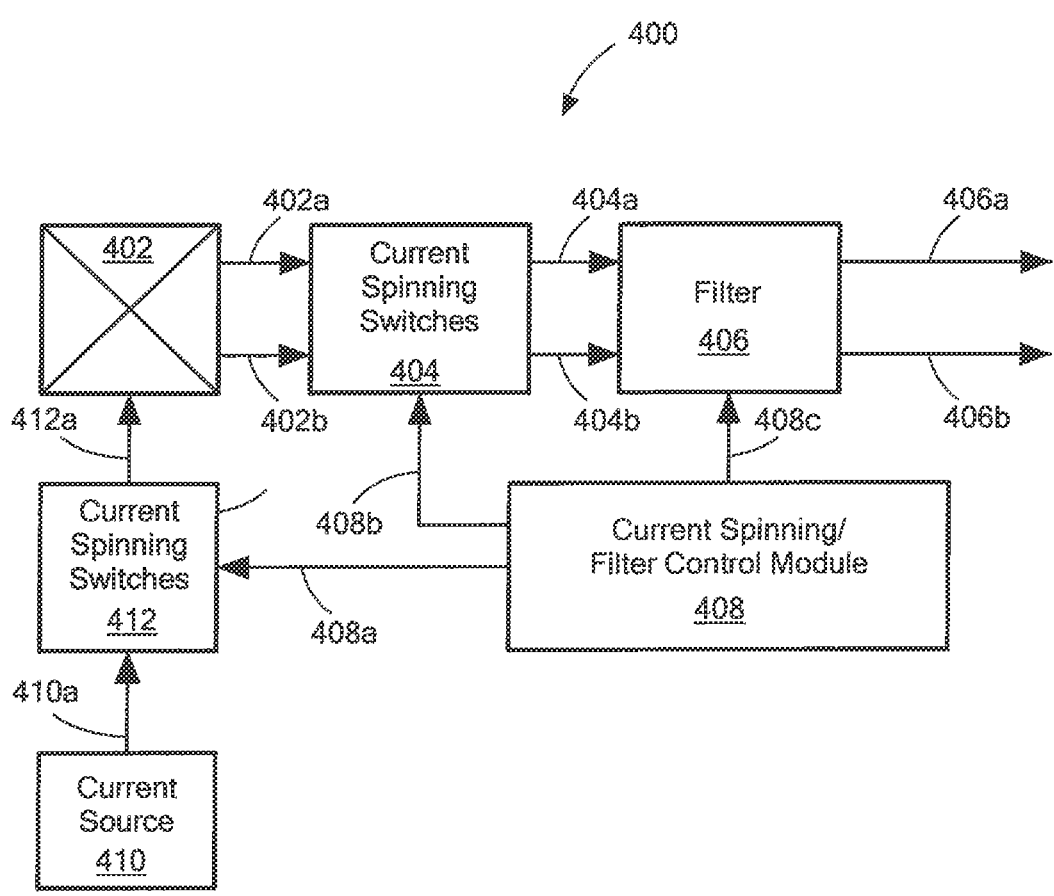
FIG. 7 is a block diagram of a magnetic field sensor that has but one planar Hall element, and that has a current spinning/filter control module to control current spinning phases.

Returning again to the subject of variations or changes of current spinning phase sequences first described above in conjunction with FIG. 3 with respect to a the CVH sensing element 102, FIGS. 7-9 show the advantages of similar current spinning phase sequence variations applied to a simple planar Hall Effect element.

Referring to FIG. 7, a simple magnetic field sensor 400 includes a planar Hall Effect element 402. The Hall element 402 is coupled to receive a current signal 412a at different selected ones of four contacts in accordance with a plurality of current spinning phases determined by current spinning switches 412. A current source 410 supplies a current signal 410a to the current spinning switches 412.

A differential output 402a, 402b of the Hall effect element 402 is coupled to current spinning switches 404, which select different ones of the four terminals as the output terminals as current spinning progresses through the plurality of phases.

Specific couplings for two or four phase current spinning of the four terminal planar Hall element are not shown herein but are well understood. Taking an example where the current spinning is done in four phases and labeling the phases with letters, a conventional arrangement would repeat the same phase sequence periodically, e.g., ABCD, where each sequence of phases occurs in a respective current spinning cycle having a cycle period. However, the magnetic field sensor 400 can include a current spinning and filter control module 408 coupled to the current spinning switches 404, 412, which can be configured to vary or change the sequence of phases from time to time or upon each cycle through a set of four phases. The variations can be fully random or pseudo-random. However, in other arrangements the variations can select between two or more current spinning phase sequences from time to time.

In one non-limiting example, current spinning phases can take on the following four sequences and then repeat: ABCD, BCDA, CDAB, DABC. In this particular example, only four current spinning phase sequences are used, each having four phases. However, it will be understood that four current spinning phases can result in twenty-four combinations of the four phases in twenty-four current spinning phase sequences. The twenty-four current spinning phase sequences can be randomly selected, pseudo-randomly selected, or periodically selected.

In a basic and non-limiting embodiment, there are only two current spinning phase sequences, e.g., ABCD and CDAB, and the current spinning phase sequence applied to the Hall element 402 can be changed from time to time between the two phase sequences. There can also be more than two phase sequences and the current spinning phase sequence applied the Hall element 402 can be changed from time to time between the more than two phase sequences.

The current spinning switches 404 are configured to provide a differential output signal 404a, 404b. A filter 406 is coupled to receive the differential signal from the current spinning switches 404 and is configured to provide a differential output signal 406a, 406b.

It will be understood that, in the frequency domain, a result of a particular type of current spinning, referred to herein as an offset current spinning, the differential signal 404a, 404b appearing at the current spinning switches has two frequency components. A baseband component is responsive to a magnetic field and remains at baseband. However, an offset signal component with the differential signal 404a, 404b is shifted to a higher frequency according to a frequency at which the current spinning sequences through the phases, i.e., a chopping frequency.

In operation, the filter 406 can remove the offset signal component of the differential signal 404a, 404b, leaving only the magnetically responsive signal component in the differential output signal 406a, 406b.

Referring now to FIG. 8, a graph 450 has a horizontal axis with a scale in units of frequency in arbitrary units and a vertical axis with a scale in amplitude in arbitrary units.

The graph 450 is representative of operation of a magnetic field sensor like the magnetic field sensor 400 of FIG. 7, but without any variation of the current spinning phase sequences applied to the Hall element 402. In other words, for example, the phase sequence ABCD repeats over and over without variation.

A spectral line 454 is representative of the magnetically responsive signal component of the differential signal 404a, 404b of FIG. 7. A spectral line 458 is representative of the offset signal component of the differential signal 404a, 404b of FIG. 7 after the current spinning operation of the current spinning switches 404, 412, but without variation of the current spinning phase sequences. A spectral line 460 is representative of a third harmonic of the offset signal component represented by the spectral line 456.

It will be understood that the spectral line 454 is representative of the magnetic field sensing element 402 being responsive to a DC magnetic field. However, the magnetic field sensing element 402 can be responsive to AC magnetic fields. Thus, a baseband bandwidth 456 is representative of a region in which the magnetic field sensing element 402 can provide signal information responsive to a magnetic field.

A transfer function 452 is representative of a transfer function of one of particular embodiment of the filter 406 of FIG. 7. In particular, the transfer function 452 is representative of a digital filter having transfer function notches. In some embodiments, it is advantageous to design the filter 406 and control the filter 406 with control signal 408c such that the notches appear at the same positions as the offset component spectral lines 458, 460. Thus, with such a filter, the differential output signal 406a, 406b will have content only within the baseband 456.

It will be recognized that use of a filter tends to slow down operation of the magnetic field sensor 400. Also, because the passband 456 must roll off below the frequency fc, the operational bandwidth or the magnetic field sensor 400 tends to be restricted.

Referring now to FIG. 9, a graph 500 has a horizontal axis with a scale in units of frequency in arbitrary units and a vertical axis with a scale in amplitude in arbitrary units.

The graph 500 is representative of operation of a magnetic field sensor like the magnetic field sensor 400, including variations or changes of the current spinning phase sequences. It will become apparent from discussion below that, using variation of the current spinning phase sequences, in some embodiments, the filter 406 of FIG. 7 can be eliminated.

A spectral line 502 is representative of the magnetically responsive signal component of the differential signal 404a, 404b. A spectral line 506 is representative of the offset signal component of the differential signal 404a, 404b after the varied current spinning operation of the current spinning switches 404, 412. A spectral line 508 is representative of a third harmonic of the offset signal component represented by the spectral line 506.

It will be understood that the spectral line 502 is representative of the magnetic field sensing element 402 being responsive to a DC magnetic field. However, the magnetic field sensing element 402 can be responsive to an AC magnetic field. Thus, a baseband bandwidth 504 is representative of a region in which the magnetic field sensing element 402 can provide signal information responsive to a magnetic field.

Other low amplitude spectral lines as shown may result from the variation of the current spinning phase sequences, depending upon the exact nature of the variation. There can be additional spectral lines that are not shown, but which are also at low amplitude.

It will be appreciated that the spectral lines 506, 508, and all other extraneous spectral lines have a much lower amplitude than the spectral lines 458, 460 of FIG. 8. In some applications, the various low amplitude spectral lines have a low enough amplitude that the filter 406 of FIG. 7 is not required in all. Having no filter at all results in a faster magnetic field sensing element and a wider bandwidth magnetic field sensing element. Accordingly, in some such embodiments, the baseband passband 504 can be substantially wider than that shown, and can be wider than the baseband passband 456 of FIG. 8. In some embodiments, the baseband passband 504 can extend well beyond the frequency 3fc.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A magnetic field sensor, comprising:
a plurality of magnetic field sensing elements, wherein each one of the plurality of magnetic field sensing elements is configured to generate a respective x-y output signal responsive to a magnetic field in an x-y plane;
an angle processing circuit coupled to receive the x-y output signals and configured to generate an uncorrected x-y angle value representative of an angle of the magnetic field in an x-y plane, wherein the uncorrected x-y angle value comprises a first angle error component; and
an angle error correction module coupled to the angle processing circuit and configured to generate an x-y angle error value indicative of an error in the uncorrected x-y angle value, wherein the angle error correction module comprises an algorithm module configured to use a sinusoidal error relationship to describe the first angel error component, sinusoidal with respect to the angle of the magnetic field;
a sine look up table coupled to the angle error correction module and configured to store a plurality of sine values;
a coefficient table memory coupled to the angle error correction module and configured to store a plurality of correction coefficients representative of amplitudes and phases of the sinusoidal error relationship, wherein the angle error correction module is further configured to use a selected one of the plurality of sine values and selected ones of the plurality of correction coefficients in the sinusoidal error relationship to determine the x-y angle error value; and
a combining module configured to combine the uncorrected x-y angle value with the x-y angle error value to generate a corrected x-y angle value having a second angle error component smaller than the first angle error component.

2. The magnetic field sensor of claim 1,
wherein the plurality of correction coefficients is associated with respective boundaries of a plurality of temperature segments, each temperature segment bounded by a pair of temperatures; and
a temperature sensor configured to generate a temperature signal representative of a temperature; wherein the angle error correction module comprises:
a segment identification module coupled to receive a temperature value representative of the temperature signal and configured to identify a temperature segment in which the temperature value falls; and
an interpolation module coupled to receive a plurality of the correction coefficients associated with the identified temperature segment, coupled to receive the temperature value, and configured to interpolate between pairs of the correction coefficients in accordance with the temperature value to generate a plurality of interpolated correction coefficients,
wherein the algorithm module is coupled to receive the plurality of interpolated correction coefficients and configured to apply the algorithm using the plurality of interpolated correction coefficients to generate the x-y angle error value.

3. The magnetic field sensor of claim 2, wherein the plurality of magnetic field sensing elements comprises a plurality of vertical Hall Effect elements arranged as a circular vertical Hall (CVH) element, wherein each one of the plurality of vertical Hall Effect elements is arranged upon a common circular implant and diffusion region in a first major surface of a semiconductor substrate, wherein the plurality of vertical Hall Effect elements is configured to generate a respective plurality of x-y output signals responsive to a magnetic field having a direction component in an x-y plane parallel to the first surface of the semiconductor substrate, the x-y plane having an x-direction and a y-direction orthogonal to the x-direction, wherein the plurality of x-y output signals is generated in a plurality of cycle periods, each cycle period corresponding to one cycle around the CVH sensing element, the cycle periods occurring at a cycle rate.

4. The magnetic field sensor of claim 3, wherein the selected sine value is selected in accordance with the uncorrected x-y angle value.

5. The magnetic field sensor of claim 3, wherein the selected sine value is selected in accordance with the x-y angle value and in accordance with an interpolated phase correction coefficient.

6. The magnetic field sensor of claim 3, wherein the algorithm module is configured to use a temperature-dependent sinusoidal error relationship to describe the first angle error component, sinusoidal with respect to the angle of the magnetic field, and wherein the plurality of correction coefficients comprises:
a plurality of correction coefficients representative of amplitudes and phases of one or more harmonics of the sinusoidal error relationship at a corresponding plurality of different temperatures.

7. The magnetic field sensor of claim 6, wherein the plurality of correction coefficients further comprises a plurality of correction coefficients representative of amplitudes and phases of first and second harmonics of the sinusoidal error relationship at the corresponding plurality of different temperatures.

8. The magnetic field sensor of claim 6, wherein the plurality of correction coefficients further comprises a plurality of correction coefficients representative of amplitudes of average angle errors of the sinusoidal error relationship at the corresponding plurality of different temperatures.

9. The magnetic field sensor of claim 6, further comprising a program control register coupled to receive a program control value, wherein the interpolation module is coupled to receive a value representative of the program control value, and, in response to the program control value, the interpolation module is configured to select the sinusoidal error relationship from among a plurality of sinusoidal error relationships.

10. The magnetic field sensor of claim 3, further comprising a program control register coupled to receive a program control value, wherein the interpolation module is coupled to receive a value representative of the program control value, and, in response to the program control value, the interpolation module is configured to select an interpolation type from among a plurality of interpolation types.

11. The magnetic field sensor of claim 3, wherein the interpolation module is configured to generate linear interpolations.

12. The magnetic field sensor of claim 3, wherein the interpolation module is configured to generate non-linear interpolations.

13. The magnetic field sensor of claim 3, wherein boundaries of the plurality of temperature segments are unequally spaced in temperature.

14. The magnetic field sensor of claim 3, further comprising:
a temperature change detection module coupled to the temperature sensor and configured to detect a change in temperature and to generate a temperature change signal indicative of a change in temperature or indicative of no change in temperature, wherein the interpolation module is coupled to the temperature change module and configured to change the plurality of interpolated correction coefficients when the temperature change signal is indicative of a change in temperature and to hold the plurality of interpolated correction coefficients when the temperature change signal is indicative of no change in temperature.

15. The magnetic field sensor of claim 3, further comprising:
a correction versus rate module coupled to receive a control signal related to the cycle rate and configured to generate a cycle rate correction value in accordance with the cycle rate; and
a second combining module configured to combine the cycle rate correction value with the x-y angle error value to generate a further corrected x-y angle value comprising a third angle error component smaller than the second angle error component.

16. The magnetic field sensor of claim 3, further comprising:
a correction versus current spin sequence module coupled to receive a control signal related to a current spin sequence of the CVH sensing element and configured to generate a current spin sequence correction value in accordance with the current spin sequence; and
a second combining module configured to combine the current spin sequence correction value with the angle error value to generate a further corrected x-y angle value comprising a third angle error component smaller than the second angle error component.

17. The magnetic field sensor of claim 3, further comprising:
a correction versus magnetic field strength module coupled to receive a control signal related to an amplitude of the magnetic field and configured to generate a magnetic field strength correction value in accordance with the amplitude of the magnetic field; and
a second combining module configured to combine the magnetic field strength correction value with the angle error value to generate a further corrected x-y angle value comprising a third angle error component smaller than the second angle error component.

18. The magnetic field sensor of claim 2, further comprising:
a program control register coupled to receive a program control value, wherein the interpolation module is coupled to receive a value representative of the program control value, and, in response to the program control value, the interpolation module is configured to select the sinusoidal error relationship from among a plurality of sinusoidal error relationships in accordance with the program control value.

19. A method of reducing an error in a magnetic field sensor, comprising:
providing a plurality of magnetic field sensing elements, wherein each one of the plurality of magnetic field sensing elements is configured to generate a respective x-y output signal responsive to a magnetic field in an x-y plane;
using the x-y output signals to generate an uncorrected x-y angle value representative of an angle of the magnetic field in an x-y plane, wherein the uncorrected x-y angle value comprises a first angle error component;
using a sinusoidal error relationship to describe the first angle error component, sinusoidal with respect to the angle of the magnetic field;
storing a plurality of sine values;
storing a plurality of correction coefficients representative of amplitudes and phases of the sinusoidal error relationship;
using a selected one of the plurality of sine values and selected ones of the plurality of correction coefficients in the sinusoidal error relationship to determine the x-y angle error value; and
combining the uncorrected x-y angle value with the x-y angle error value to generate a corrected x-y angle value having a second angle error component smaller than the first angle error component.

20. The method of claim 19,
wherein the plurality of correction coefficients is associated with respective boundaries of a plurality of temperature segments, each temperature segment bounded by a pair of temperatures, wherein the generating the x-y angle error value further comprises;

generating a temperature signal representative of a temperature;

identifying a temperature segment in which the temperature value falls;

interpolating between pairs of the correction coefficients in accordance with the temperature value to generate a plurality of interpolated correction coefficients; and applying the algorithm using the plurality of interpolated correction coefficients to generate the x-y angle error value.

21. The method of claim 20, wherein the plurality of magnetic field sensing elements comprises a plurality of vertical Hall Effect elements arranged as a circular vertical Hall (CVH) element, wherein each one of the plurality of vertical Hall Effect elements is arranged upon a common circular implant and diffusion region in a first major surface of a semiconductor substrate, wherein the plurality of vertical Hall Effect elements is configured to generate a respective plurality of x-y output signals responsive to a magnetic field having a direction component in an x-y plane parallel to the first surface of the semiconductor substrate, the x-y plane having an x-direction and a y-direction orthogonal to the x-direction, wherein the plurality of x-y output signals is generated in a plurality of cycle periods, each cycle period corresponding to one cycle around the CVH sensing element, the cycle periods occurring at a cycle rate.

22. The method of claim 21, wherein the selected sine value is selected in accordance with the uncorrected x-y angle value.

23. The method of claim 21, wherein the selected sine value is selected in accordance with the uncorrected x-y angle value and in accordance with an interpolated phase coefficient.

24. The method of claim 21, wherein the applying the algorithm comprises:
using a temperature dependent sinusoidal error relationship to describe the first angle error component, sinusoidal with respect to the angle of the magnetic field, and wherein the plurality of correction coefficients comprises:
a plurality of correction coefficients representative of amplitudes and phases of one or more harmonics of the sinusoidal error relationship at a corresponding plurality of different temperatures.

25. The method of claim 24, wherein the plurality of correction coefficients further comprises a plurality of correction coefficients representative of amplitudes and phases of first and second harmonics of the sinusoidal error relationship at the corresponding plurality of different temperatures.

26. The method of claim 24, wherein the plurality of correction coefficients further comprises a plurality of correction coefficients representative of amplitudes of average angle errors of the sinusoidal error relationship at the corresponding plurality of different temperatures.

27. The method of claim 24, further comprising:
receiving a program control value; and
selecting the sinusoidal error relationship from among a plurality of sinusoidal error relationships.

28. The method of claim 21, further comprising
receiving a program control value; and
selecting an interpolation type from among a plurality of interpolation types.

29. The method of claim 21, wherein the interpolation module is configured to generate linear interpolations.

30. The method of claim 21, wherein the interpolation module is configured to generate non-linear interpolations.

31. The method of claim 21, wherein boundaries of the plurality of temperature segments are unequally spaced in temperature.

32. The method of claim 21, further comprising:
detecting a change in temperature;
generating a temperature change signal indicative of a change in temperature or indicative of no change in temperature; and
changing the plurality of interpolated correction coefficients when the temperature change signal is indicative of a change in temperature and holding the plurality of interpolated correction coefficients when the temperature change signal is indicative of no change in temperature.

33. The method of claim 21, further comprising:
generating a cycle rate correction value in accordance with the cycle rate; and
combining the cycle rate correction value with the angle error value and with the uncorrected angle value to generate a further corrected x-y angle value comprising a third angle error component smaller than the second angle error component.

34. The method of claim 21, further comprising:
generating a current spin sequence correction value in accordance with the current spin sequence; and
combining the current spin sequence correction value with the angle error value to generate a further corrected x-y angle value comprising a third angle error component smaller than the second angle error component.

35. The method of claim 21, further comprising:
generating a magnetic field strength correction value in accordance with an amplitude of the magnetic field; and
combining the magnetic field strength correction value with the angle error value to generate a further corrected x-y angle value comprising a third angle error component smaller than the second angle error component.

36. The method of claim 19, further comprising:
receiving a program control value; and
selecting the sinusoidal error relationship from among a plurality of sinusoidal error relationships in accordance with the program control value.

* * * * *